US009018745B2

(12) United States Patent
Shimizu et al.

(10) Patent No.: US 9,018,745 B2
(45) Date of Patent: Apr. 28, 2015

(54) METHOD FOR MANUFACTURING SEMICONDUCTOR DEVICE, AND SEMICONDUCTOR DEVICE

(71) Applicant: Renesas Electronics Corporation, Kawasaki-shi (JP)

(72) Inventors: Akito Shimizu, Kawasaki (JP); Kenji Nishikawa, Kawasaki (JP); Sadayuki Moroi, Kawasaki (JP); Tomoo Imura, Kawasaki (JP)

(73) Assignee: Renesas Corporation, Kanagawa-shi, Kanagawa (JP)

( * ) Notice: Subject to any disclaimer, the term of this patent is extended or adjusted under 35 U.S.C. 154(b) by 115 days.

(21) Appl. No.: 13/898,410

(22) Filed: May 20, 2013

(65) Prior Publication Data

US 2014/0001620 A1 Jan. 2, 2014

(30) Foreign Application Priority Data

Jun. 27, 2012 (JP) ................................. 2012-144092

(51) Int. Cl.

*H01L 23/495* (2006.01)
*H01L 21/56* (2006.01)
*H01L 23/00* (2006.01)
*H01L 23/31* (2006.01)

(52) U.S. Cl.

CPC .......... *H01L 23/49568* (2013.01); *H01L 21/56* (2013.01); *H01L 24/97* (2013.01); *H01L 2224/32245* (2013.01); *H01L 2224/48091* (2013.01); *H01L 2224/48247* (2013.01); *H01L 2224/48257* (2013.01); *H01L 2224/48465* (2013.01); *H01L 2224/49109* (2013.01); *H01L 2224/49171* (2013.01); *H01L 2224/73265* (2013.01); *H01L 2224/78301* (2013.01); *H01L 23/3107* (2013.01); *H01L 23/3142* (2013.01); *H01L 23/49548* (2013.01); *H01L 23/49551* (2013.01); *H01L 23/49579* (2013.01); *H01L 2224/97* (2013.01)

(58) Field of Classification Search

CPC .......................... H01L 21/56; H01L 23/49568
USPC .................................. 257/676, 686; 438/123
See application file for complete search history.

(56) References Cited

U.S. PATENT DOCUMENTS

| | | | | |
|---|---|---|---|---|
| 6,329,706 B1 | 12/2001 | Nam | | |
| 2002/0140064 A1* | 10/2002 | Wu et al. | ....................... | 257/670 |
| 2005/0046008 A1* | 3/2005 | Gai | .............................. | 257/690 |

FOREIGN PATENT DOCUMENTS

| | | |
|---|---|---|
| JP | 2001-77275 A | 3/2001 |
| JP | 2001-85591 A | 3/2001 |

* cited by examiner

*Primary Examiner* — Theresa T Doan
(74) *Attorney, Agent, or Firm* — McGinn IP Law Group, PLLC

(57) ABSTRACT

A method according to the invention has a bonding process of mounting a semiconductor chip on an upper surface of a die pad that has the upper surface whose area is larger than a reverse side of the semiconductor chip. It also has a sealed body formation process of sealing the semiconductor chip so that an undersurface opposite to the upper surface of the die pad may be exposed after the bonding process. Here, the upper surface of the die pad is arranged around an area over which the semiconductor chip is mounted, and has a hollow part arrangement area in which a groove or multiple holes are formed. Moreover, surface roughness of the upper surface is made coarser than surface roughness of the undersurface.

9 Claims, 28 Drawing Sheets

METHOD FOR MANUFACTURING SEMICONDUCTOR DEVICE, AND SEMICONDUCTOR DEVICE

CROSS-REFERENCE TO RELATED APPLICATIONS

The disclosure of Japanese Patent Application No. 2012-144092 filed on Jun. 27, 2012 including the specification, drawing and abstract is incorporated herein by reference in its entirety.

BACKGROUND

The present invention relates to a semiconductor device and its manufacturing technology, for example, to a technology that is effective when being applied to a semiconductor device whose semiconductor chip is mounted on a die pad.

Japanese Unexamined Patent Publication No. 2001-85591 and Japanese Unexamined Patent Publication No. 2001-77275 describe forming long and slender grooves over an upper surface and an undersurface of a die pad part (chip pad) over which a semiconductor chip is mounted.

SUMMARY

As a package mode of a semiconductor device, there is a so-called tab exposure type semiconductor device in which a die pad (tab) over which a semiconductor chip is mounted is exposed from a sealed body. Since the tab exposure type semiconductor device can enlarge an area of a heat radiation path to the outside of the semiconductor device, it can improve heat dissipation. Moreover, a die pad can be used as a terminal by electrically coupling the die pad and the semiconductor chip.

In the semiconductor device like this, a plane area of the die pad becomes larger than a plane area of the semiconductor chip. However, as the plane area of the die pad becomes larger, exfoliation of the sealed body for sealing the semiconductor chip and the die pad becomes easy to occur, and deterioration in the reliability of the semiconductor device poses a problem.

Other problems and new features will become clear from description and accompanying drawing of this description.

Explaining briefly an outline of what is representative that is disclosed in this application, it will be as follows.

That is, a method for manufacturing a semiconductor device that is one embodiment has a bonding process of mounting the semiconductor chip over a first plane of the die pad having the first plane whose area is larger than that of a reverse side of the semiconductor chip. Moreover, it has a sealed body formation process of sealing the semiconductor chip so that a second plane opposite to the first plane of the die pad may be exposed after the bonding process. Here, the first plane of the die pad has a hollow part arrangement area that is arranged around an area over which the semiconductor chip is mounted and in which a groove or multiple holes are formed. Moreover, surface roughness of the first plane is made coarser than surface roughness of the second plane.

Explaining briefly an effect attained by a representative embodiment disclosed in this application, it will be as follows.

That is, according to the representative embodiment disclosed in this application, reliability of the semiconductor device can be improved.

DETAILED DESCRIPTION

Figure 1:
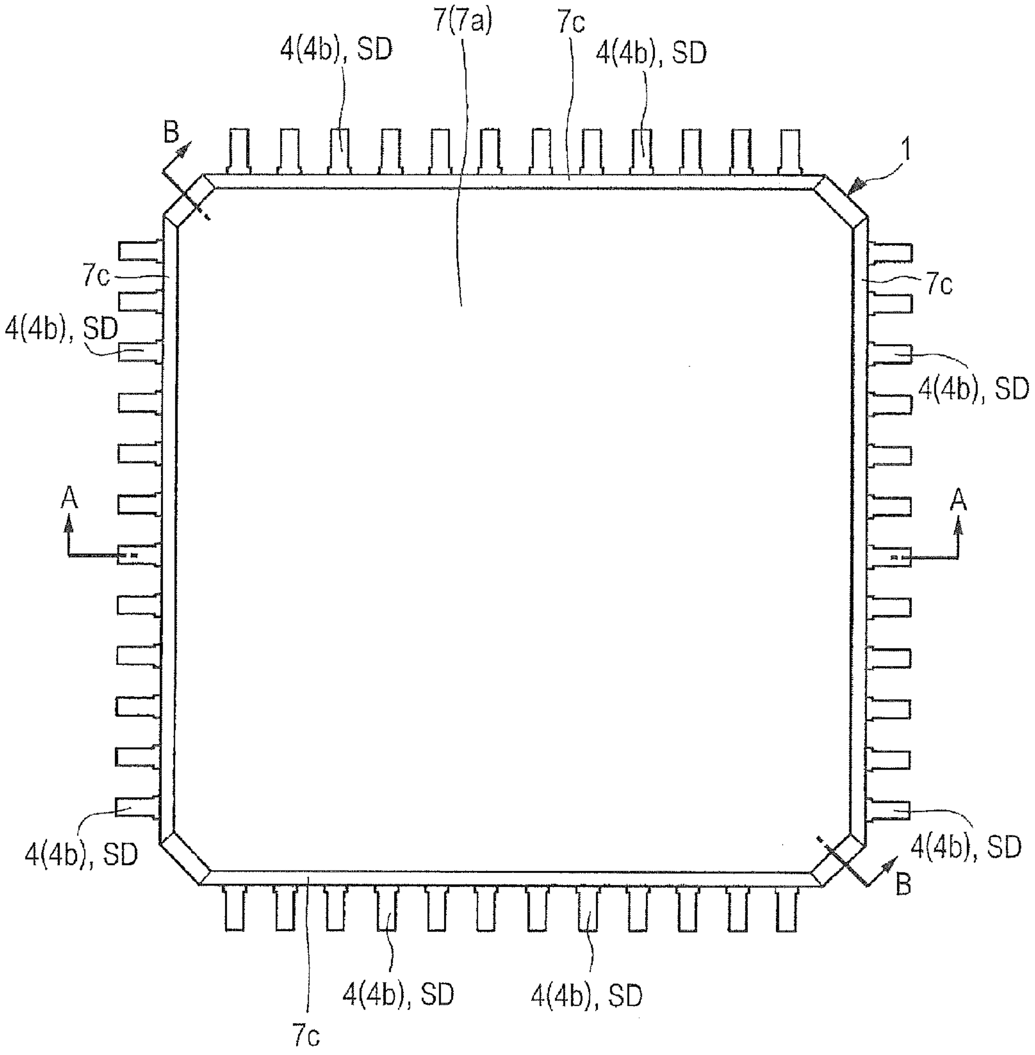
FIG. 1 is a top view of a semiconductor device that is one embodiment.

Explanation of Description Style, Fundamental Terms, Usage in this Application Although the description of the embodiment is described being divided into multiple sections, etc. for convenience as needed in this application, these are not mutually independent and individual except for a case where it is clearly indicated that it is not so in particular: each one is each portion of a single example; or each one is a partial detail of an other example; each one is a modification of a part or the whole of the other example, etc. Moreover, a repeated explanation of the same portion is omitted in principle. Moreover, each component in the embodiment is not indispensable except for the case where it is clearly indicated that it is not dispensable in particular, the case where it (or they) is limited to the number theoretically, and the case where it is clearly not so from its context.

Similarly, in the description of the embodiment, etc., even when "X comprised of A", etc. is said about a material, a composition, etc., it is not intended to exclude X that includes a constituent other than A except for the case where it is clearly indicated that X should not include any constituent other than A and the case where it is clearly not so from its context. For example, speaking of a component, it means "X containing A as a principal component," etc. For example, when speaking of a "silicon member," etc., it is not limited to pure silicon, but it goes without saying that it includes a SiGe (silicon germanium) alloy, in addition to this, a multi-component alloy whose principal component is silicon, and a member containing an other ingredient, etc. Moreover, when speaking of gold plating, a Cu layer, nickel plating, etc., they shall not be necessarily limited to pure materials, but they shall include members that contain gold, Cu, nickel, etc. as their principal components, respectively, except for a case where it is especially clearly indicated that it is not so.

Furthermore, when referring to a specific numerical value or quantity, the numerical value may be a numerical value exceeding the specific numerical value and may be a numerical value less than the specific numerical value, except for the case where it is clearly indicated that the numerical value or quantity is limited to such values in particular, the case where it is limited to that number theoretically, and the case where it is clearly not so from its context.

Moreover, in each diagram of the embodiment, an identical or similar part is represented by an identical or analogous symbol or reference numeral, and its explanation is not repeated in principle.

Moreover, in the accompanying drawings, there is the case where hatching, etc. is omitted even when the drawing is a cross section, when the drawing with the hatching becomes complicated on the contrary or when an area can be clearly distinguished from a void. In connection with this case, there is a case where a contour line in the background is omitted when it is clear from an explanation, etc. even in the case of a closed hole in a plan view. Furthermore, not in the case of a cross section, the hatching or a dot pattern may be given in the drawing in order to clearly indicate that it is not a void or to clearly indicate a boundary of areas.

Figure 2:
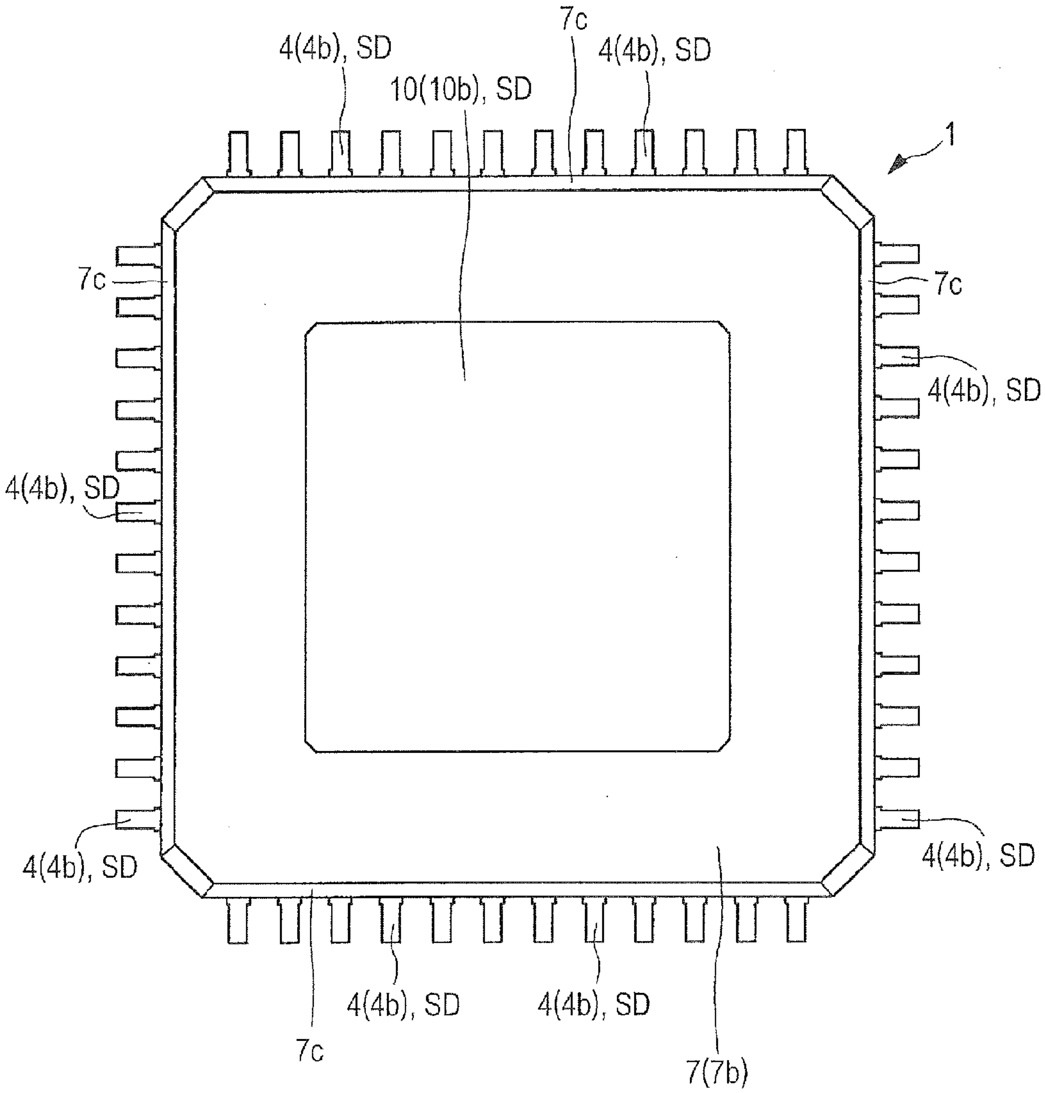
FIG. 2 is a bottom view of the semiconductor device shown in FIG. 1.
Figure 3:
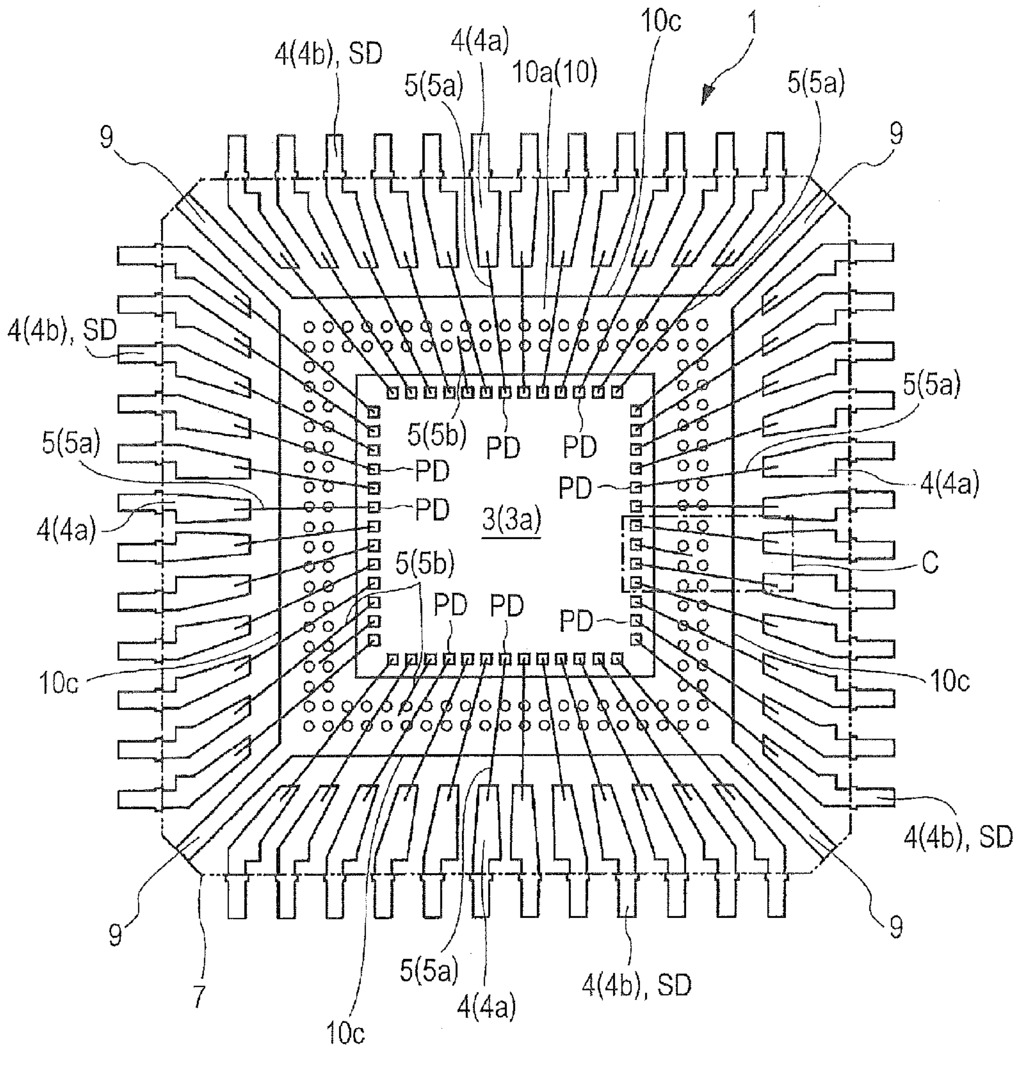
FIG. 3 is a perspective plan view showing an internal structure of the semiconductor device in a state in which a sealed body shown in FIG. 1 is removed.
Figure 4:
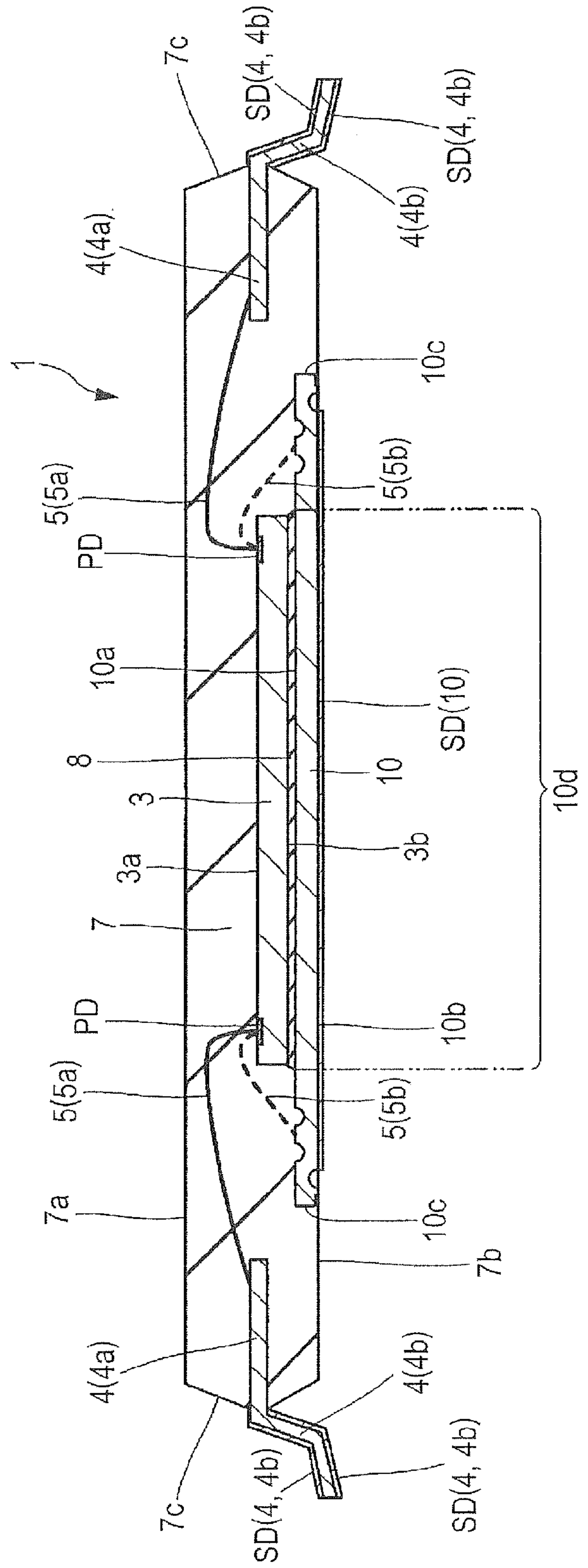
FIG. 4 is a sectional view taken along an A-A line of FIG. 1.
Figure 5:
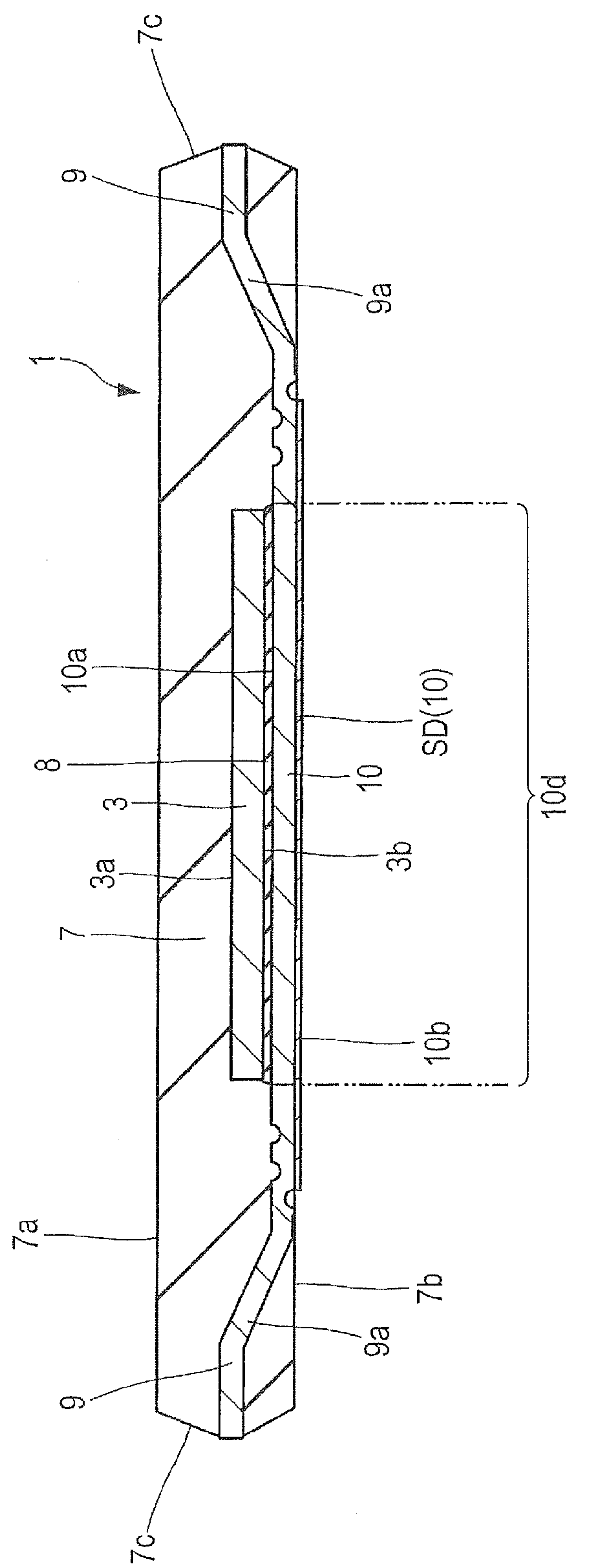
FIG. 5 is a sectional view taken along a B-B line of FIG. 1.

Although the technology explained in the following embodiment is applicable to semiconductor devices of various package types manufactured using lead frames, in this embodiment, a mode for carrying out the invention in which it is applied to a QFP (Quad Flat Package) type semiconductor device such that multiple leads serving as external terminals are exposed from a side face of a sealed body will be explained as one example. FIG. 1 in a top view of a semiconductor device of this embodiment, and FIG. 2 is a bottom view of the semiconductor device shown in FIG. 1. Moreover, FIG. 3 is a perspective plan view showing an internal structure of the semiconductor device with the sealed body shown in FIG. 1 removed. Moreover, FIG. 4 is a sectional view taken along an A-A line of FIG. 1, and FIG. 5 is a sectional view taken along a B-B line of FIG. 1.

<Semiconductor Device>

First, an outline of a configuration of a semiconductor device 1 of this embodiment will be explained using FIG. 1 to FIG. 5. The semiconductor device 1 of this embodiment has a die pad (chip mounting part, tab) 10 (refer to FIG. 3 to FIG. 5) and a semiconductor chip 3 (refer to FIG. 3 to FIG. 5) mounted over the die pad 10 through a die bonding material (adhesive) 8 (refer to FIG. 3 to FIG. 5). Moreover, the semiconductor device 1 has multiple leads (terminals, external terminals) 4 arranged next to (in the periphery of) the semiconductor chip 3 (die pad 10), and multiple wires (conductive members) 5 (refer to FIG. 3 and FIG. 4) that electrically couple the multiple pads (electrodes, bonding pads) PD (refer to FIG. 3 and FIG. 4) of the semiconductor chip 3 and the multiple leads 4, respectively. Moreover, the semiconductor device 1 has a sealed body (resin body) 7 for sealing the semiconductor chip 3 and the multiple wires 5. Moreover, multiple suspension leads 9 are coupled to the die pad 10.

<Appearance Structure>

First, an appearance structure of the semiconductor device 1 will be explained. A planar shape of the sealed body (resin body) 7 shown in FIG. 1 has a rectangular shape, and in this embodiment, it is a square, for example. In detail, each corner part is subjected to a chamfering processing, and thereby, this inhibits chipping of the sealed body 7. The sealed body 7 has an upper surface 7*a*, an undersurface (reverse side, mounting surface) 7*b* (refer to FIG. 2) opposite to this upper surface 7*a*, and side faces 7*c* located between this upper surface 7*a* and the undersurface 7*b*. The side face 7*c* is made to be an inclined plane, as shown in FIG. 4. The corner part of the sealed body 7 includes a surrounding area of a corner that is an intersection of arbitrary sides (two principal sides) that intersect among four sides (four principal sides) of the sealed body 7. Incidentally, strictly speaking, since a part of the corner part of the sealed body 7 is subjected to the chamfering processing as shown in FIG. 1, the intersection of the principal sides is arranged outside the corner part of the sealed body 7. However, since a chamfered part is small enough as compared with the length of the principal side, the explanation is given supposing that a center of the chamfered part is the corner of the sealed body 7 in this application. That is, in this application, in an area where two arbitrary sides (two principal sides) among four sides (four principal sides) of the sealed body 7 intersect, the chamfered part corresponds to the corner part when the area is subjected to the chamfering processing, and an intersection of the two arbitrary sides (two principal sides) corresponds to the corner part when the area is not subjected to the chamfering processing. Hereinafter, in this application, when referring to the corner part of the sealed body 7, it is used to signify the same meaning and content as described above, especially except for the case where a purport that it is used as a different meaning and content is clearly described.

Moreover, as shown in FIG. 1 and FIG. 2, the multiple leads 4 are arranged along each side (each principal side) of the sealed body 7, respectively, in the semiconductor device 1. The multiple leads 4 are each comprised of a metal material, respectively. In this embodiment, it is comprised of copper (Cu), or a layered metal film made by forming a metal film (its illustration is omitted) comprised, for example, of nickel (Ni) over a surface of a base material comprised of copper (Cu). Moreover, in the example shown in FIG. 1 and FIG. 2, each of the multiple leads 4 is formed so that a part thereof (outer lead part 4*b*) extrudes outward from the side face 7*c* of the sealed body 7 and is formed into a shape of a gull wing outside the sealed body 7. In other words, the outer lead parts 4*b* of the multiple leads 4 each have multiple bends, respectively, and an end part of the outer lead part 4*b* is arranged at a position lower than the undersurface 7*b* of the sealed body 7. Moreover, a metal film SD is formed over an exposed part (outer lead part 4*b*) coming out from the sealed body 7 of the lead 4, and covers the undersurface of the above-mentioned base material. The metal film SD is comprised of a solder film (outer plating film) formed, for example, by a plating method, and functions as a bonding material when the lead 4 is bonded to a terminal on an unillustrated mounted substrate side.

The metal film SD of this embodiment is comprised of a so-called lead-free solder that substantially contains no lead (Pb). For example, it is of only tin (Sn), tin-bismuth (Sn—Bi), tin-copper-silver (Sn—Cu—Ag), or the like. Here, the lead-free solder means one whose content of lead (Pb) is less than or equal to 0.1 wt %, and this content is defined as a standard of RoHS (Restriction of Hazardous Substances) Directive.

Moreover, as shown in FIG. 2, an undersurface 10*b* of the die pad (chip mounting part, tab) 10 is exposed from the sealed body 7 over the undersurface 7*b* of the sealed body 7. That is, the semiconductor device 1 is a die pad exposure type (tab exposure type) semiconductor device.

The die pad 10 is comprised of a metal material whose thermal conductivity is higher than that of the sealed body 7, and, in this embodiment, is comprised, for example, of copper (Cu), or a layered metal film obtained by forming a metal film (its illustration is omitted) comprised of nickel (Ni) over the surface of a base material comprised of copper (Cu). Thus, the die pad exposure type semiconductor device can improve heat dissipation of its package as compared with the semiconductor device such that the die pad 10 is not exposed by exposing a metal member, for example, of copper (Cu), etc. (die pad 10) whose thermal conductivity is higher than that of the sealed body 7. Moreover, when mounting the semiconductor device 1 over an unillustrated mounted substrate, if the undersurface 10*b* of the die pad 10 is coupled with a terminal of the mounted substrate, for example, through a solder material (bonding material), heat generated in the semiconductor device can be discharged to the mounted substrate side further efficiently.

Moreover, as shown in FIG. 3 and FIG. 4, in this embodiment, the semiconductor chip 3 and the die pad 10 are electrically coupled, and the die pad 10 is used as an external terminal. Thus, by exposing the undersurface 10*b* of the die pad 10 and electrically coupling it with an unillustrated mounted substrate, a terminal arrangement space of the semiconductor device 1 can be effectively utilized. Moreover, the die pad 10 is supplied, for example, with a reference potential (e.g., earth potential). From the viewpoint of improving an electrical characteristic of the semiconductor device 1, it is desirable that a terminal for supplying the reference potential should have an enlarged area in a transmission path. That is, as shown in FIG. 3 or FIG. 4, the area of the transmission path can be enlarged by using the die pad 10 as an external terminal that is supplied with the reference potential and thereby the electrical characteristic of the semiconductor device 1 can be improved.

Moreover, in the example shown in FIG. 2, the metal film SD that functions as the bonding material at the time of mounting is formed over the undersurface 10*b* of the die pad 10, and covers the undersurface of the base material. The metal film SD is the solder film formed, for example, by a plating method as described above. Thus, it is possible to make the die pad 10 easy to couple with a terminal of an unillustrated mounted substrate by forming the metal film SD over an exposed surface of the die pad 10 in this way.

<Internal Structure>

Next, an internal structure of the semiconductor device 1 will be explained. As shown in FIG. 3, an upper surface (chip mounting surface) 10*a* of the die pad 10 has a planar shape of quadrangle (quadrilateral). In this embodiment, it is a square, for example. Moreover, in this embodiment, an external size (plane size) of the die pad 10 is larger than an external size (plane size of a reverse side 3*b* shown in FIG. 4) of the semiconductor chip 3. It is possible to improve the heat dissipation by mounting the semiconductor chip 3 over the die pad 10 that has a larger area than its external size in this way and exposing the undersurface 10*b* of the die pad 10 from the sealed body 7 as shown in FIG. 2. Other detailed structures of the die pad 10 will be described later.

Moreover, as shown in FIG. 3, the multiple leads 4 are arranged around the die pad 10 (in the periphery of the semiconductor chip 3). As shown in FIG. 4, each of the multiple leads 4 has an inner lead part 4*a* that is sealed by the sealed body 7 and the outer lead part 4*b* that is exposed from the sealed body 7. Moreover, the metal film SD is formed over surfaces (upper surface, undersurface, and side faces) of the outer lead part 4*b*. Moreover, the inner lead part 4*a* includes a wire bonding area to which the wire 5 is bonded.

Moreover, as shown in FIG. 3, multiple suspension leads 9 are coupled (linked) to the die pad 10. One end part of each of the multiple suspension leads 9 is coupled to a corner part (corner) of the die pad 10 forming a quadrangle in a plan view, respectively. Moreover, the other end part of each of the multiple suspension leads extends toward the corner part of the sealed body 7 and is exposed form the sealed body 7 in the corner part, respectively.

Incidentally, as shown in FIG. 4, the die pad 10 is arranged at a height different from that of the inner lead part 4*a* (offset arrangement). In detail, the die pad 10 is arranged in a position lower than that of the inner lead part 4*a* (down set arrangement). In a package in which the lead 4 is formed into the shape of a gull wing as in this embodiment, it is desirable that the lead 4 is derived from a position that is a middle of the upper surface 7*a* and the undersurface 7*b* in the side face 7*c* of the sealed body 7. This is because the inner lead part 4*a* is firmly fixed by the sealed body 7. On the other hand, in order to expose the die pad 10 from the sealed body 7, it is necessary to arrange it at a height different from that of the inner lead part 4*a*. For this reason, in this embodiment, the die pad 10 is offset arranged (down set arranged).

As a method for performing the out offset arrangement in this way, an inclination part 9*a* (refer to FIG. 5) is formed in each of the multiple suspension leads 9 that support the die pad 10. Thereby, the die pad 10 can be offset arranged (down set arrangement).

Moreover, as shown in FIG. 3, the semiconductor chip 3 is mounted over the die pad 10. The semiconductor chip 3 is mounted over a chip mounting area 10*d* (refer to FIG. 4 and FIG. 5) located in a center of the die pad 10. As shown in FIG. 4, the semiconductor chip 3 is mounted over the die pad 10 through the die bonding material (adhesive) 8 with the reverse side 3*b* facing an upper surface 10*a* of the die pad 10. That is, the semiconductor chip 3 is mounted by a method whereby an opposite surface (reverse side 3_b_) of a surface (principal plane) 3_a_ over which the multiple pads PD are formed is made to face the chip mounting surface (upper surface 10_a_), i.e., by a so-called face-up installation. This die bonding material 8 is an adhesive used in die bonding the semiconductor chip 3, and for this, an epoxy system adhesive or a conductive adhesive that is an epoxy system thermosetting resin in which metallic particles comprised of silver (Ag), etc. are contained is used, for example.

As shown in FIG. 3, a planar shape of the semiconductor chip 3 mounted over the die pad 10 is comprised of a quadrangle. In this embodiment, it is a square, for example. Moreover, as shown in FIG. 4, the semiconductor chip 3 has a surface (principal plane, upper surface) 3_a_, a reverse side (principal plane, undersurface) 3_b_ opposite to the surface 3_a_, and a side face located between these surface 3_a_ and reverse side 3_b_. Then, as shown in FIG. 3 and FIG. 4, multiple pads (bonding pads) PD are formed over the surface 3_a_ of the semiconductor chip 3, and in this embodiment, the multiple pads PD are formed along each side of the surface 3_a_. Moreover, although illustration is omitted, over the principal plane of the semiconductor chip 3 (in detail, in a semiconductor device formation area provided over the upper surface of a base material (semiconductor substrate) of a base material of the semiconductor chip 3), multiple semiconductor devices (circuit elements) are formed, and the multiple pads PD are electrically coupled with these semiconductor devices through wiring (its illustration is omitted) formed over a wiring layer arranged inside the semiconductor chip 3 (in detail, between the surface 3_a_ and an unillustrated semiconductor device formation area).

The semiconductor chip 3 (in detail, the semiconductor substrate of the semiconductor chip 3) is comprised, for example, of silicon (Si). Moreover, over the surface 3_a_, an insulating layer that covers the base material of the semiconductor chip 3 and the wiring is formed, and a surface of each of the multiple pads PD is exposed from the insulating layer in an opening formed in this insulating layer. Moreover, this pad PD is comprised of a metal, and in this embodiment, it is comprised, for example, of aluminum (Al). Incidentally, an alloy layer whose principal component is aluminum (Al) may be used for the pad PD.

Moreover, as shown in FIG. 3, the multiple leads 4 comprised, for example, of copper (Cu) that is the same as the die pad 10 are arranged around the semiconductor chip 3 (in detail, in the periphery of the die pad 10). Then, the multiple pads (bonding pads) PD formed over the surface 3_a_ of the semiconductor chip 3 are electrically coupled with the multiple leads 4 through the multiple wires (conductive members) 5, respectively. The wire 5 is comprised, for example, of gold (Au), one part of the wire 5 (e.g., one end part) is bonded to the pad PD, and the other part thereof (e.g., the other end part) is bonded to a bonding area of the lead 4. Incidentally, although illustration is omitted, it is desirable to form a plating film that is comprised, for example, of silver (Ag) or gold (Au) over a surface of the bonding area of the lead 4. A bonding strength with the wire 5 comprised of gold (Au) can be improved by forming the plating film comprised of silver (Ag) or gold (Au) over the surface of the bonding area (wire bonding area) of the lead 4 (inner lead part 4_a_).

Moreover, in this embodiment, one part of the multiple pads PD are electrically coupled with a wire bonding area of the die pad 10 through wires (conductive members) 5_b_. In other words, the multiple wires 5 that are electrically coupled with the multiple pads PD of the semiconductor chip 3 include the wires 5_a_ that electrically couple the multiple pads PD and the multiple leads 4, and the wire 5_b_ that electrically couple the pads PD and the die pad 10. Thus, by electrically coupling the pad PD of the semiconductor chip 3 and the die pad 10 through the wire 5_b_, the die pad 10 can be utilized as an external terminal. For example, as described above, the reference potential (e.g., earth potential) is supplied to the die pad 10, and the reference potential is supplied to the semiconductor chip 3 through the die pad 10 and the wire 5_b_.

<Detailed Structure of Die Pad>

Figure 6:
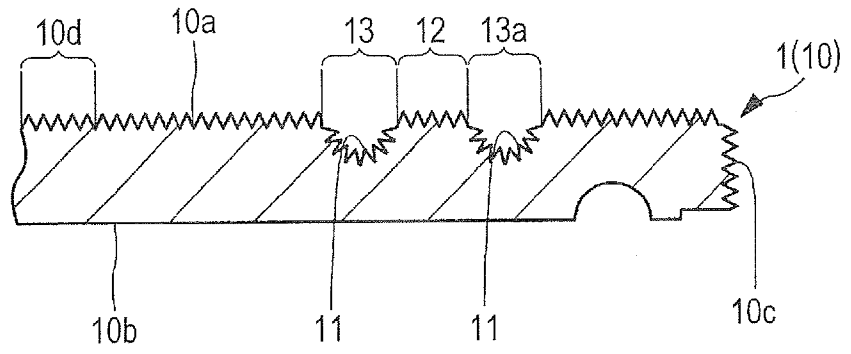
FIG. 6 is a diagram schematically showing a surface state of a die pad shown in FIG. 4.
Figure 7:
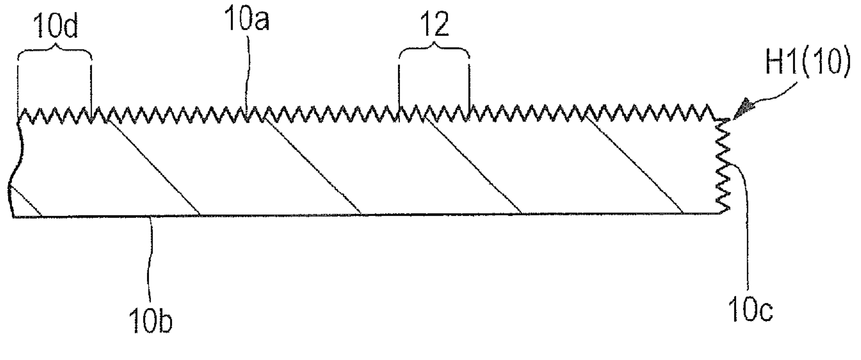
FIG. 7 is a diagram schematically showing a surface state of a die pad of a semiconductor device different from that of FIG. 6.
Figure 8:
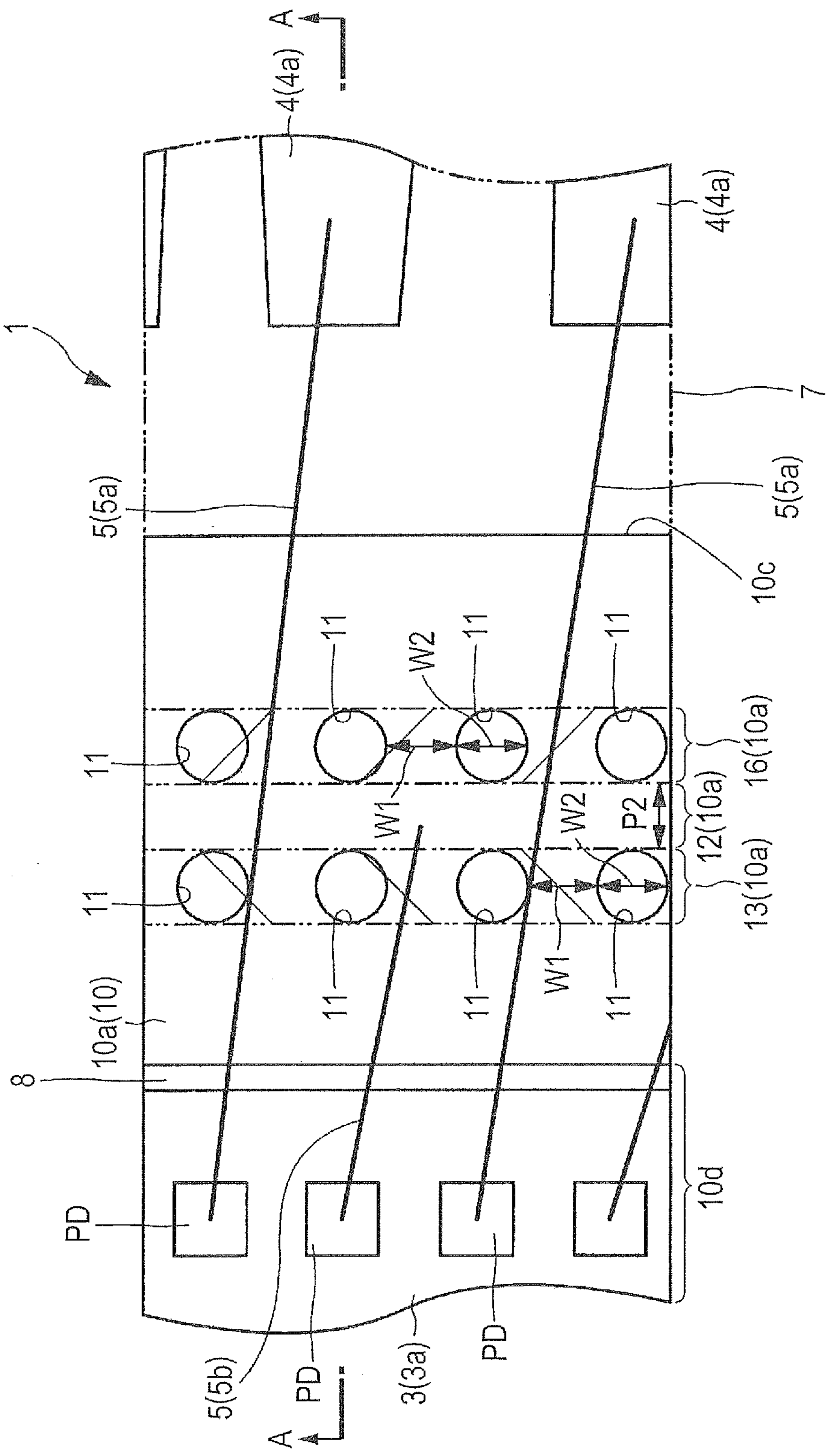
FIG. 8 is an enlarged plan view of a part C of FIG. 3.
Figure 9:
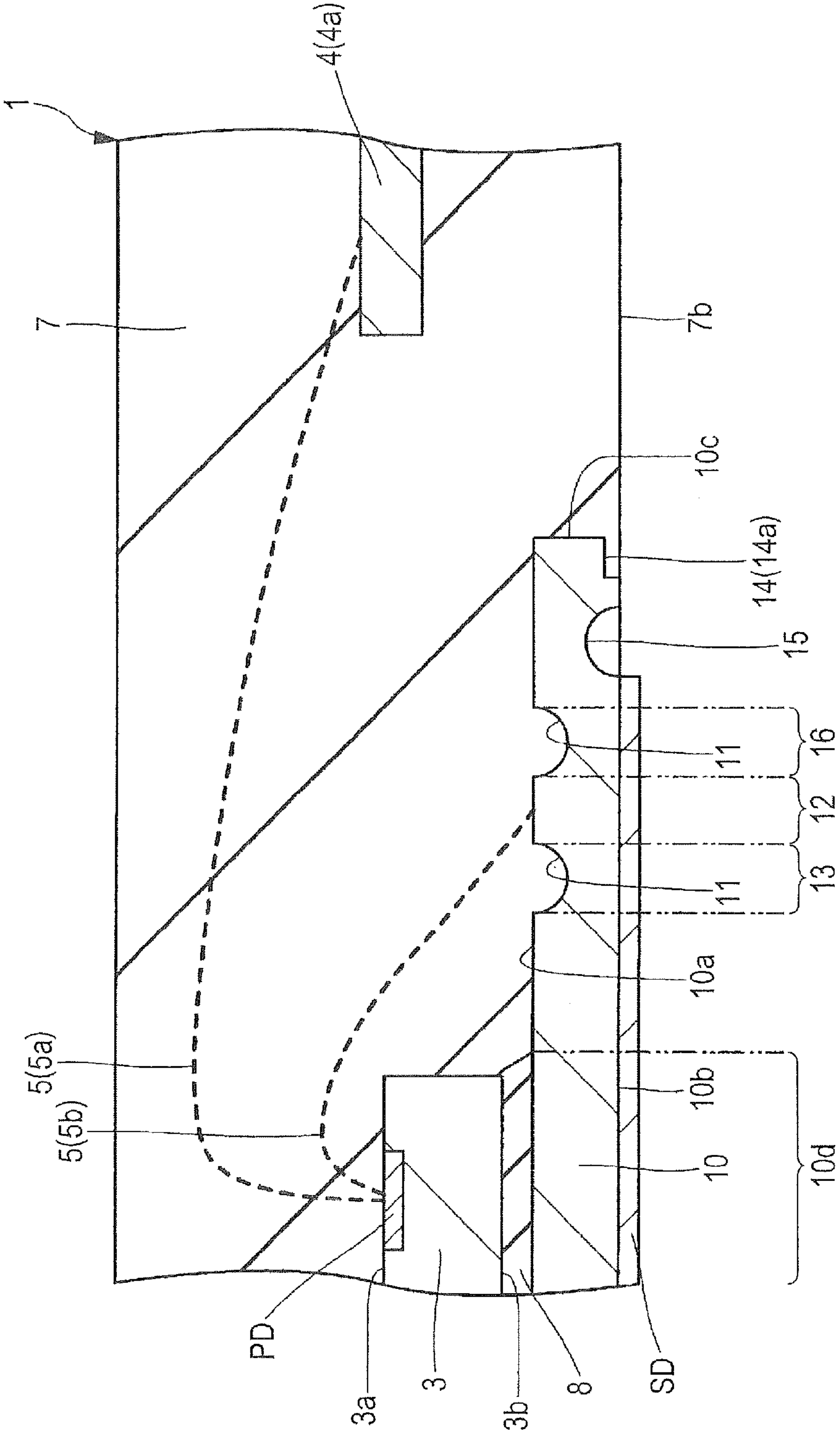
FIG. 9 is an enlarged sectional view taken along an A-A line of FIG. 8.
Figure 10:
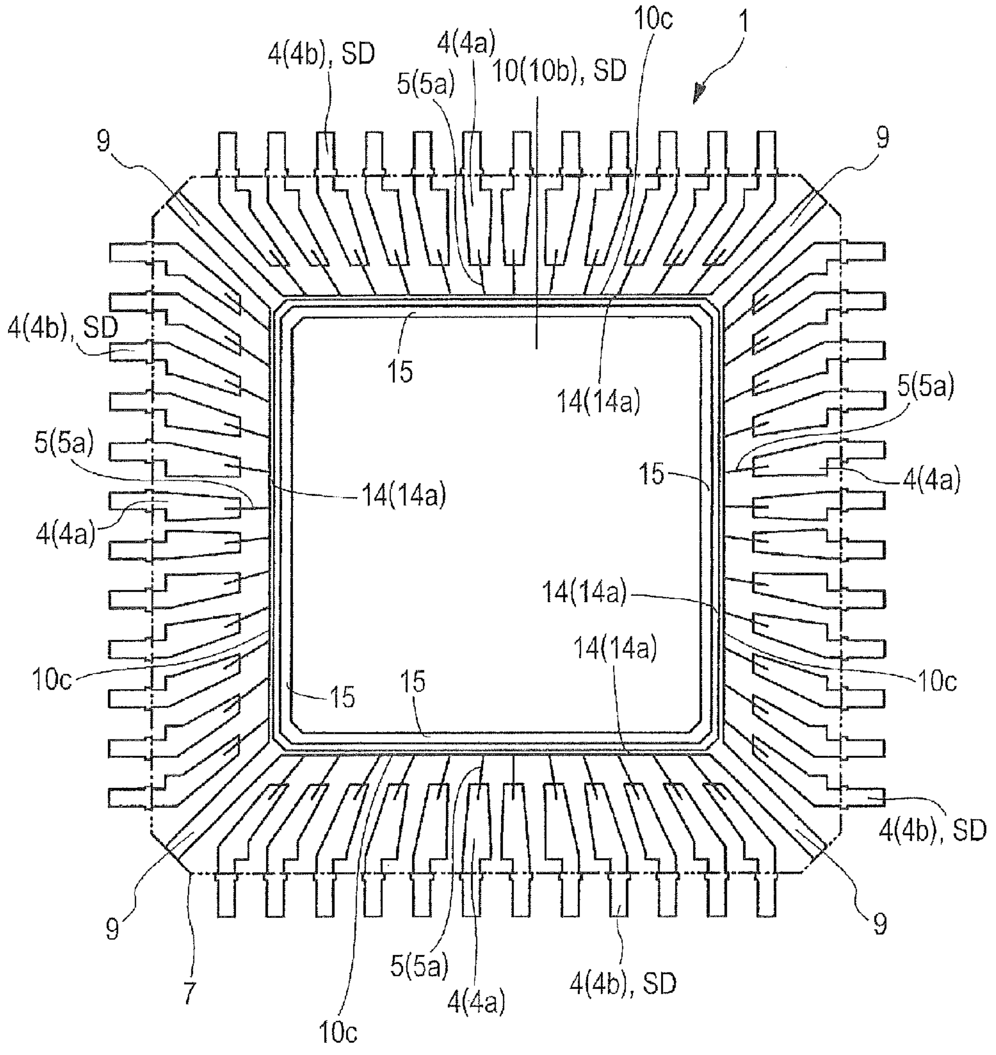
FIG. 10 is a perspective plan view showing an undersurface side of the semiconductor device shown in FIG. 3.

Next, a detailed structure of the die pad 10 shown in FIG. 2 to FIG. 4 and an effect acquired by adopting the structure will be explained. FIG. 6 is an explanatory diagram schematically showing a surface state of the die pad shown in FIG. 4, and FIG. 7 is a diagram schematically showing a surface state of the die pad of the semiconductor device different from that of FIG. 6. Moreover, FIG. 8 is an enlarged plan view of a part C of FIG. 3 and FIG. 9 is an enlarged sectional view thereof taken along an A-A line of FIG. 8. Moreover, FIG. 10 is a perspective plan view showing the undersurface side of the semiconductor device shown in FIG. 3. Incidentally, in FIG. 9, in order to clearly indicate that one part of the wire 5 (wire 5_a_) is coupled to the lead 4 and the other part of the wire 5 (wire 5_b_) is coupled to the die pad 10, the wire 5_a_ and the wire 5_b_ are shown by dotted lines, respectively.

In the semiconductor device 1 of this embodiment, a plane are of the die pad 10 is larger than a plane area of the reverse side 3_b_ of the semiconductor chip 3, as explained using FIG. 1 to FIG. 5. Then, as shown in FIG. 4, the undersurface 10_b_ of the die pad 10 whose plane area is larger than a plane area of the semiconductor chip 3 is exposed from the sealed body 7. However, as a plane area of the die pad 10 becomes larger, exfoliation of the sealed body 7 for sealing the semiconductor chip 3 and the die pad 10 becomes easy to occur, and the deterioration in the reliability of the semiconductor device 1 becomes a problem. For example, since a coefficient of linear expansion differs between the semiconductor chip 3 and the die pad 10, they become easy to produce exfoliation in an adhesion interface of the semiconductor chip 3 and the die pad 10 by being impressed with a temperature cycle. In detail, in an adhesion interface of the die bonding material 8 that adheres and fixes the semiconductor chip 3 and the die pad 10, a stress resulting from a temperature cycle load occurs, and the exfoliation occurs by the stress. Since the stress resulting from this temperature cycle load becomes large in proportion to the plane area of the die pad 10, as the plane area of the die pad 10 becomes larger, the exfoliation becomes easy to occur.

Then, after the exfoliation occurs in an adhesion interface of the die pad 10 and the die bonding material 8, if the temperature cycle load is impressed further, the exfoliation will develop toward a peripheral part (side face 10_c_) of the die pad 10 (along the upper surface 10_a_ of the die pad 10) starting from an occurrence position of the exfoliation. Moreover, although the sealed body 7 and the upper surface 10_a_ of the die pad 10 are closely adhered between the chip mounting area 10_d_ of the die pad 10 and the side face 10_c_, an adhesion strength of the die pad 10 and the sealed body 7 is comparable to or less than the adhesion strength of the die pad 10 and the die bonding material 8. For this reason, the above-mentioned exfoliation develops to an adhesion interface of the die pad 10 and the sealed body 7.

Since decrease in the adhesion of the die pad 10 and the sealed body 7 decreases will cause falling-off of the die pad 10 from the sealed body 7, etc., it is desirable to prevent or inhibit a development of exfoliation from the viewpoint of inhibiting the deterioration in the reliability of the semiconductor device 1. In particular, in the case where the wire 5_b_ is bonded to a part of the upper surface 10_a_ of the die pad 10 like this embodiment, the development of exfoliation to a bonding part of the wire 5*b* and the die pad 10 will cause disconnection of the wire 5*b*. It is therefore desirable to prevent or inhibit the development of exfoliation from the viewpoint of improving the electric reliability of the semiconductor device 1.

Hence, the inventors of this application inventor examined a technology of preventing or inhibiting the development of exfoliation. First, a configuration of inhibiting the development of exfoliation by making surface roughness of the upper surface 10*a* of the die pad 10 coarser than the surface roughness of the undersurface 10*b* and thereby widening an adhesion area of the die pad 10 and the sealed body 7 was examined. Incidentally, in this examination, in order to verify an effect of making the surface roughness of the upper surface 10*a* coarser, the semiconductor device of a structure where holes (hollow parts) 11 shown in FIG. 6 were not provided was examined with the surface roughness of the upper surface 10*a* of the die pad 10 made coarser, as shown in FIG. 7. Moreover, as the method for making the surface roughness of the upper surface 10*a* coarse, a method for depositing a plating metal surface whose surface is roughened intentionally, i.e., a so-called roughening plating method is used when forming a plating film, e.g., a nickel film. With the roughening plating method, a plating metal surface whose surface is roughened can be deposited intentionally by lowering a current density, a supply rate of a plating liquid (metal ion), etc. at the time of electroplating. Moreover, the explanation will be given using a ratio (Sr) of the surface area of the roughened surface to a unit area of a flat surface as an index indicating a degree of surface roughness. Incidentally, as an index indicating the degree of the surface roughness, there is an average value (Ra) of the amount of unevenness per unit length, etc. The inventors of this application have found experimentally that when Sr=1.2, Ra becomes about 30 nm, and when Sr=1.6, Ra becomes about 80 nm.

In a semiconductor device H1 (refer to FIG. 7) of a structure where the multiple holes (hollow part) 11 shown in FIG. 6 are not provided, the inventors of this application checked the surface roughness of the upper surface 10*a* of the die pad 10 with the surface roughness set to each of Sr=1.2, 1.4, and 1.6. As a result of the evaluation, it has been found that in any case, the exfoliation develops to the wire bonding area (bonding area 12 shown in FIG. 7) of the die pad 10. That is, as shown in FIG. 7, it has been found that the development of exfoliation cannot fully be inhibited only by making the surface roughness of the upper surface 10*a* of the die pad 10 coarser than the surface roughness of the undersurface 10*b*.

Hence, as shown in FIG. 8, the inventors of this application provide a hollow part arrangement area 13 (area to which hatching is given to identify it in FIG. 8) in which the multiple holes 11 are formed between the bonding area (wire bonding area) 12 in which the wire 5*b* is bonded to the die pad 10 and the chip mounting area 10*d* over which the semiconductor chip 3 is mounted, in addition to making the surface roughness of the upper surface 10*a* of the die pad 10 coarser than that of the undersurface 10*b* as shown in FIG. 7. That is, the upper surface 10*a* of the die pad 10 of this embodiment is located between the chip mounting area 10*d* and the multiple leads 4, and has the bonding area 12 to which the wire 5*b* is bonded. Moreover, the upper surface 10*a* is arranged between the bonding area 12 and the chip mounting area 10*d*, and has the hollow part arrangement area 13 in which the multiple holes 11 are formed. Furthermore, as shown in FIG. 6, the surface roughness of the upper surface 10*a* including the chip mounting area 10*d*, the bonding area 12, and the hollow part arrangement area 13 is coarser than the surface roughness of the undersurface 10*b*.

As a result of evaluating an effect of preventing or inhibiting the development of exfoliation with the above-mentioned configuration, it has been found that the development of exfoliation is inhibited in the hollow part arrangement area 13, and the exfoliation becomes difficult to reach up to the bonding area 12. That is, it has been found that the development of exfoliation can be inhibited. It has been found that, especially, with the surface roughness of the upper surface 10*a* being set equal to or more than Sr=1.4, the development of exfoliation can be stopped almost certainly in the hollow part arrangement area 13.

Incidentally, for the check, in the configuration shown in FIG. 8 and FIG. 9, the evaluation was performed on the semiconductor device (its illustration is omitted) that is not subjected to the roughening plating as shown in FIG. 6 on the upper surface 10*a* of the die pad 10. As a result, it has been found that in the case where the roughening plating is not performed and thereby the surface roughness of the upper surface 10*a* is comparable to the surface roughness of the undersurface 10*b*, the development of exfoliation cannot be fully inhibited even if the hollow part arrangement area 13 in which the multiple holes 11 are formed is provided. That it has been found that the development of exfoliation can be inhibited by providing the hollow part arrangement area 13 and by making the surface roughness of the upper surface 10*a* including the hollow part arrangement area 13 coarser than that of the undersurface 10*b*.

Moreover, as shown in FIG. 8, in the case of forming the multiple holes 11 in the hollow part arrangement area 13, it is desirable to make a gap W1 of the adjacent holes 11 be twice or less than an opening size W2 of the hole 11 from the viewpoint of stopping the development of exfoliation. Moreover, if the gap W1 of the adjacent holes 11 is made equal to or less than the opening size W2 of the hole 11, it is especially desirable in a point that the development of exfoliation can be stopped more certainly.

Moreover, in this embodiment, by providing the hollow part arrangement area 13 for inhibiting the development of exfoliation between the bonding area 12 and the chip mounting area 10*d*, it is possible to inhibit the development of exfoliation starting from the chip mounting area 10*d* side from developing to the bonding area 12. That is, since the exfoliation is hard to be generated in the bonding area 12 in which the wire 5*b* and the die pad 10 are bonded, it is possible to inhibit deterioration in the reliability of the electrical coupling, for example, due to fracture of the wire 5*b*, etc.

Incidentally, as a cause of the exfoliation of the die pad 10 and the sealed body 7, the mode in which the exfoliation occurred in a bonded part of the semiconductor chip 3 and the die pad 10 and the exfoliation developed to the peripheral part of the die pad 10 was explained. However, in the case of the semiconductor device of a type in which the undersurface 10*b* of the die pad 10 is exposed from the sealed body 7 like this embodiment, there is an other mode as a cause whereby the die pad 10 and the sealed body 7 exfoliate from each other. That is, there is a case where moisture invades from a coherent interface of the sealed body 7 and the die pad 10 in the exposed part (undersurface 10*b*) of the die pad 10, and this moisture makes the die pad 10 and the sealed body 7 exfoliate.

Moisture causing this exfoliation invades mainly from the outside of the package. In an end part of the exposed part of the die pad 10, if the sealed body 7 and the die pad 10 adhere to each other, invasion of moisture can be prevented. However, if there is the interstice between the die pad 10 and the sealed body 7, the moisture that invaded into the interstice will invade into the inside along the die pad 10, which will reduce adhesion of the die pad 10 and the sealed body 7.

When forming the sealed body 7 so that the undersurface 10*b* of the die pad 10 may be exposed, a peripheral part of the undersurface 10*b* of the die pad 10 may be in a state of being covered by excessive resin. This excessive resin is called a resin burr or a resin flash. If the resin burr is formed in the peripheral part of the undersurface 10*b* of the die pad 10, a coupling area of the undersurface 10*b* of the die pad 10 will be restricted. Moreover, in the following processes, since falling of the resin burr becomes a cause of generating functional inhibitory, a burr removal process of removing the resin burr becomes necessary. However, since this process takes a method, for example, whereby an interface of the resin burr and the die pad 10 is removed by electrolysis, for example, in an alkali chemical, etc., an interstice becomes easy to be formed between the sealed body 7 and the die pad 10. That is, by inhibiting an occurrence of the resin burr, the burr removal process can be omitted or a stress to the resin due to the burr removal can be alleviated, and thereby it is possible to inhibit the die pad 10 and the sealed body 7 from exfoliating from each other.

Hence, the inventors of this application examined a technology of inhibiting the occurrence of the resin burr, and have found out a configuration of this embodiment. That is, as shown in FIG. 10, in the semiconductor device 1, a stepped part 14 that ranges to the undersurface 10*b* of the die pad 10 is provided in the peripheral part of the undersurface 10*b*. In other words, the die pad 10 has an undersurface (surface, stepped surface) 14*a* that ranges to the side face 10*c* inside the side face 10*c*, and the undersurface 14*a* is located at a height between the upper surface 10*a* and the undersurface 10*b*. As shown in FIG. 10, the stepped part 14 is formed so as to surround the peripheral part of the undersurface 10*b* of the die pad 10 continuously all over the whole periphery. Moreover, in the semiconductor device 1, a groove part 15 is provided between a central part and the stepped part of the undersurface 10*b* of the die pad 10. The groove part 15 is formed inside the stepped part 14 (on a central part side of the undersurface 10*b*), and is continuously formed so as to surround a periphery of the central part of the undersurface 10*b* all over the whole periphery.

Although details will be described later, the stepped part 14 provided in the peripheral part of the undersurface 10*b* of the die pad 10 has a function of inhibiting the peripheral part of the die pad 10 from deforming due to a supply pressure of the resin in a process of forming the sealed body 7. Moreover, the groove part 15 formed inside the stepped part 14 functions as a dam part for damming up the resin that invaded toward a central part of the die pad 10 after coming over the stepped part 14.

As shown in FIG. 10, by arranging the stepped part 14 and the groove part 15 side by side from the peripheral part side of the undersurface 10*b* of the die pad 10, it is possible to prevent the resin from invading into the inside of the groove part 15 at the time of forming the sealed body 7. That is, the occurrence of the resin burr can be inhibited. Then, a range of moisture that invades into the upper surface 10*a* of the die pad 10 from the outside of the package can be lengthened. As a result, it is possible to inhibit the invasion of moisture from the undersurface 10*b* side of the die pad 10, and to inhibit exfoliation of the die pad 10 and the sealed body 7 resulting from the moisture invasion.

Moreover, regarding a relationship of depths of the stepped part 14 and the groove part 15 (length in a thickness direction of the die pad 10), it is desirable that a depth of the stepped part 14 is made deeper than a depth of the groove part 15 as shown in FIG. 9. In other words, it is desirable that a distance from the undersurface 14*a* of the stepped part 14 to the undersurface 10*b* of the die pad 10 should be shorter than the distance from a deepest part of the groove part 15 to the undersurface 10*b* of the die pad 10 in the thickness direction of the die pad 10. As described above, the stepped part 14 has a function of inhibiting the peripheral part of the die pad 10 from deforming due to the supply pressure of the resin. In detail, providing the stepped part 14 inhibits a phenomenon that the supply pressure of the resin concentrates on the peripheral part of the undersurface 10*b*, and pushes the peripheral part of the die pad 10 upward. Therefore, the stepped part 14 should just have such a depth as can inhibit concentration of the pressure. Since when the stepped part 14 deepens extremely, the plate thickness of the peripheral part of the die pad 10 in a plan view becomes thin, there is an apprehension that it may become a cause that deforms the peripheral part on the contrary. On the other hand, the groove part 15 functions as the dam part for damming up the resin that invaded toward the central part of the die pad 10 after coming over the stepped part 14, as described above. For this reason, a capacity of housing the excessive resin can be enlarged by deepening the groove part 15. That is, by making the depth of the groove part 15 deeper than the depth of the stepped part 14 as shown in FIG. 9, it is possible to effectively inhibit the occurrence of the resin burr. Then, by inhibiting the occurrence of the resin burr, it is possible to inhibit the invasion of moisture from the undersurface 10*b* side of the die pad 10 caused by the burr removal process, and to inhibit the exfoliation of the die pad 10 and the sealed body 7 resulting from the moisture invasion.

Moreover, as shown in FIG. 8 and FIG. 9, in this embodiment, the upper surface 10*a* of the die pad 10 is arranged between the bonding area 12 and the peripheral part (side face 10*c*) of the die pad 10, and further has a hollow part arrangement area 16 in which the multiple holes (hollow part) 11 are formed. For this reason, even in the case where moisture invades from the undersurface 10*b* side of the die pad 10 and the exfoliation of the die pad 10 and the sealed body 7 occurs, the exfoliation can be prevented from developing to the bonding area 12. That is, by arranging the bonding area between the hollow part arrangement areas 13, 16 and bonding the wire to the bonding area 12, a fall of the reliability of the electrical coupling caused by fracture of the wire 5*b*, etc. can be prevented more certainly.

However, in the case where the stepped part 14 and the groove part 15 are provided like this embodiment, the possibility of the invasion of moisture from the undersurface side of the die pad 10 can be reduced considerably. Therefore, as a modification of this embodiment, the semiconductor device can be also made to have a configuration where the hollow part arrangement area 16 shown in FIG. 8 and FIG. 9 is not provided. Moreover, as an other modification of this embodiment, the semiconductor device can be configured so that neither the stepped part 14 nor the groove part 15 shown in FIG. 8 and FIG. 9 is formed and the hollow part arrangement area 16 is provided. In this case, although addition of the burr removal process increases a possibility that moisture may invade from the undersurface 10*b* of the die pad 10, the development of exfoliation can be stopped by providing the hollow part arrangement area 16.

Moreover, from the viewpoint of maximizing an exposed area of the die pad 10, it is desirable that the groove part 15 should be arranged on the peripheral part side. Moreover, in the case where the holes 11 or the groove parts 15 are formed over the both sides of the upper surface 10*a* and the undersurface 10*b* of the die pad 10 like this embodiment, it is desirable to make the hollow part arrangement areas 13, 16 on the upper surface 10*a* side not overlap the groove part 15 and the stepped part 14 on the undersurface 10*b* side in the thickness direction from the viewpoint of securing the strength of the die pad 10. From the viewpoint of securing the strength of the die pad 10 and maximizing the exposed area of the die pad 10, it is therefore desirable that the groove part 15 should be formed at a position nearer to the side face 10*c* of the die pad 10 than the hollow part arrangement areas 13, 16 as shown in FIG. 9

<Manufacturing Process of Semiconductor Device>

Figure 11:
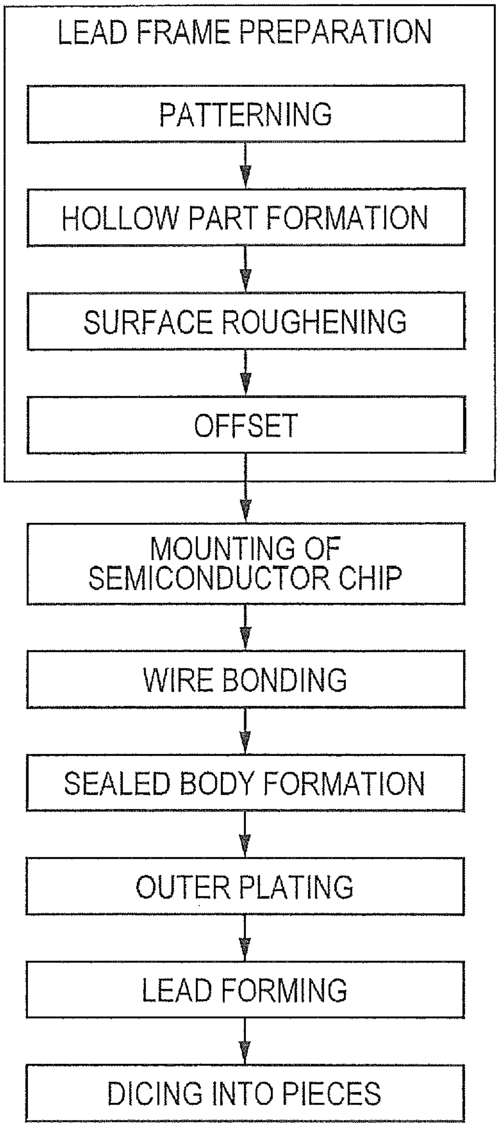
FIG. 11 is an explanatory diagram showing an assembly flow of the semiconductor device shown in FIG. 1 to FIG. 10.

Next, a manufacturing process of the semiconductor device shown in FIG. 1 to FIG. 10 will be explained. The semiconductor device 1 in this embodiment is manufactured according to an assembly flow shown in FIG. 11. FIG. 11 is a diagram showing the assembly flow of the semiconductor device shown in FIG. 1 to FIG. 10.

1. Lead Frame Preparation Process

Figure 12:
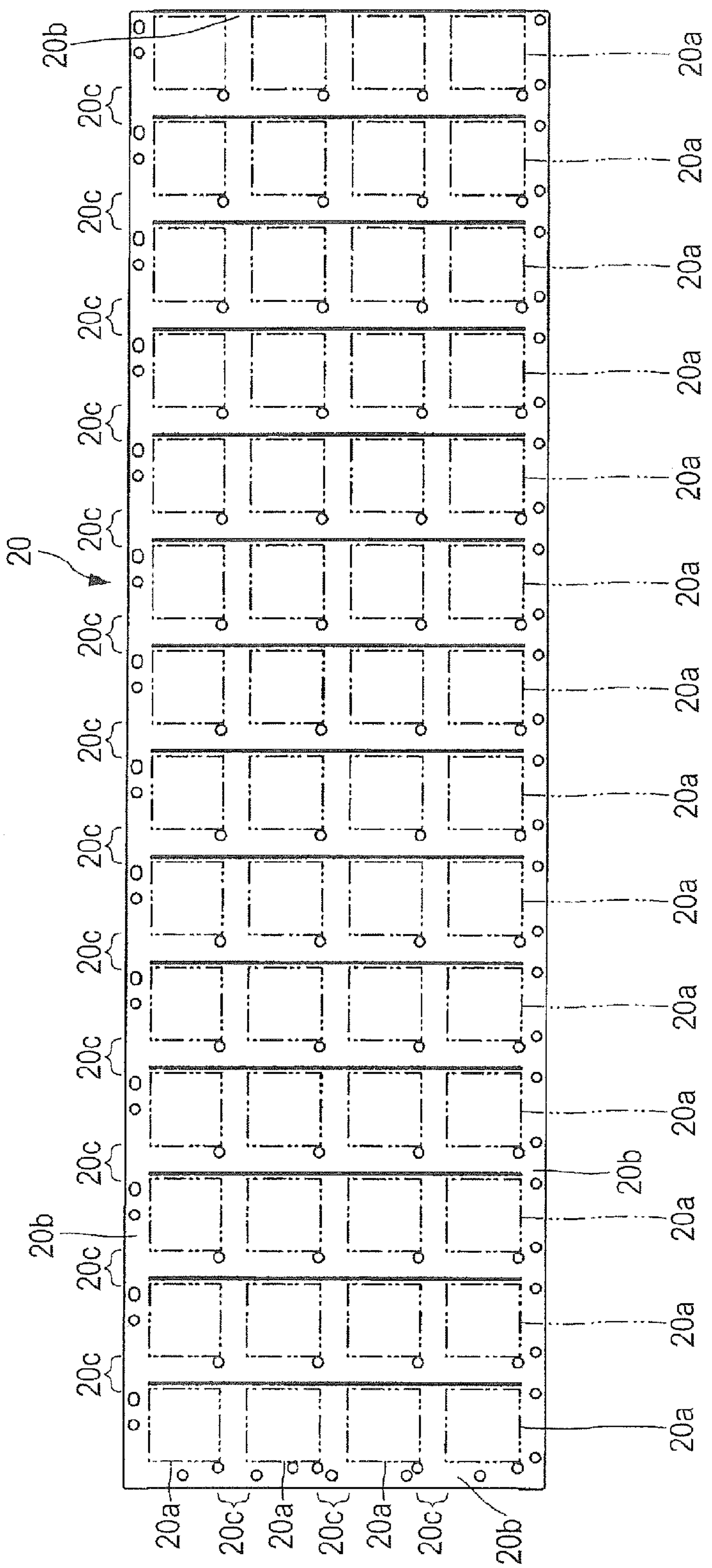
FIG. 12 is a plan view showing an overall structure of a lead frame prepared in a lead frame preparation process of FIG. 11.
Figure 13:
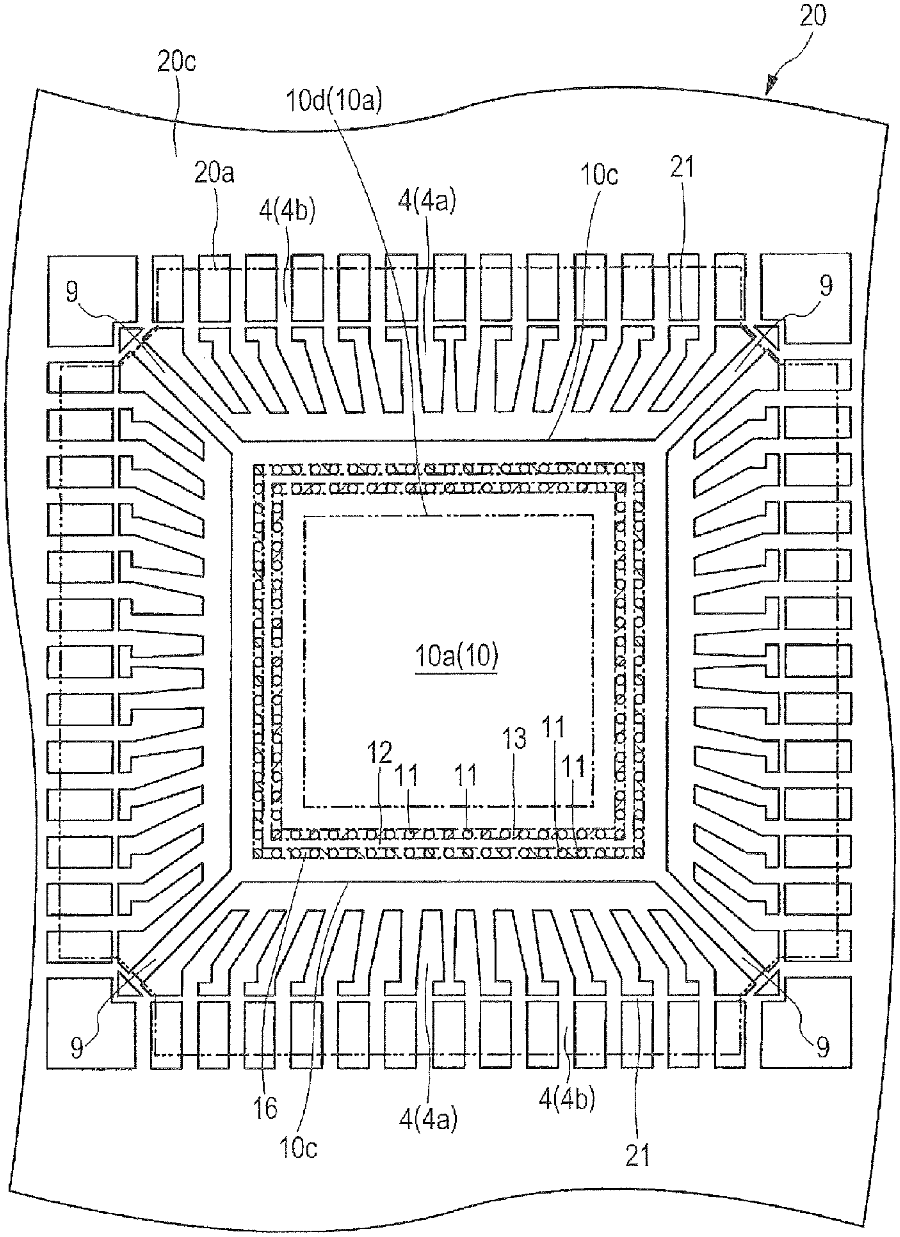
FIG. 13 is an enlarged plan view of a part of multiple product formation areas shown in FIG. 12.
Figure 14:
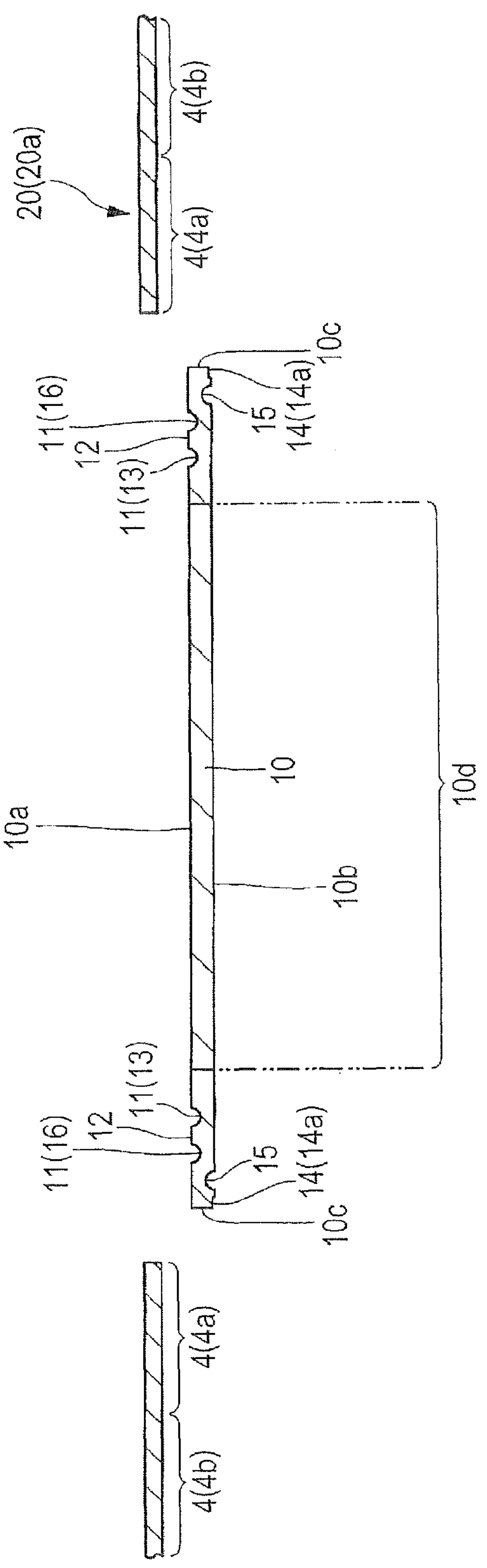
FIG. 14 is an enlarged sectional view of the lead frame shown in FIG. 13.

First, as a lead frame preparation process shown in FIG. 11, a lead frame 20 as shown in FIG. 12 is prepared. FIG. 12 is a plan view showing an overall structure of the lead frame that is prepared in the lead frame preparation process of FIG. 11, and FIG. 13 is an enlarged plan view of a part of the multiple product formation areas shown in FIG. 12. Moreover, FIG. 14 is an enlarged sectional view of the lead frame shown in FIG. 13.

The lead frame 20 prepared in this process has multiple product formation areas 20*a* inside an outer frame 20*b*. In the example shown in FIG. 12, in the lead frame 20, 14 product formation areas 20*a* are arranged in a line direction and four product formation areas 20*a* are arranged in a column direction in a matrix form, and the lead frame 20 has a total of 56 product formation areas 20*a*. The lead frame 20 is comprised of a metal, and in this embodiment, is comprised, for example, of copper (Cu) or a layered metal film obtained by forming a metal film (its illustration is omitted) comprised of nickel (Ni) on a base material comprised of copper (Cu).

Moreover, between the product formation areas 20*a*, frame parts (dam parts) 20*c* surrounding peripheries of the product formation areas 20*a*, respectively, are arranged. As shown in FIG. 13, the frame part 20*c* is formed so as to surround the periphery of the multiple leads 4, and is formed in one body with the outer frame 20*b* shown in FIG. 12.

Moreover, as shown in FIG. 13, the die pad 10 that shapes a quadrangle in a plan view is formed in a central part of each product formation area 20*a*. The multiple suspension leads 9 are coupled to each of the four corner parts of the die pad 10, respectively, and the leads 9 are arranged so as to extend toward the corner parts of the product formation area 20*a*, respectively. Moreover, multiple leads 4 are formed between the multiple suspension leads 9 around the die pad 10, respectively. Moreover, the multiple leads 4 are coupled to the frame part 20*c* arranged outside the multiple leads 4 with respect to the die pad 10, respectively. In other words, the lead frame 20 has the frame part 20*c*, the die pad 10 that is arranged inside the frame part 20*c* in a plan view, the multiple suspension leads 9 that link the frame part 20*c* and the die pad 10, and the multiple leads 4 that are arranged between the die pad 10 and the frame part 20*c* and are coupled to the frame part 20*c*. Moreover, the multiple leads 4 are linked through a tie bar (dam part) 21. In a sealed body formation process to be described later, this tie bar 21 functions as the dam part for damming up leak of the resin. That is, an outline of the sealed body 7 (refer to FIG. 1) in a plan view is specified by the tie bar 21 surrounding the die pad 10.

Moreover, the multiple holes (hollow parts) 11 explained using FIG. 6 to FIG. 9 are formed over the upper surface 10*a* of the die pad 10 that is arranged in the central part of each product formation area 20*a*. In detail, the bonding area (wire bonding area) 12 to which a wire is bonded in a wire bonding process to be described later is provided over the upper surface 10*a* of the die pad 10. Moreover, in a semiconductor chip mounting process to be described later, the hollow part arrangement area 13 where the multiple holes 11 are formed between the chip mounting area 10*d* over which the semiconductor chip is mounted and the bonding area 12 is provided. Moreover, as explained using FIG. 6, the surface roughness of the upper surface 10*a* of the die pad 10 is made coarser than that of the undersurface 10*b*. Moreover, in an example shown in FIG. 13, the upper surface 10*a* of the die pad 10 further has the hollow part arrangement area 16 that is arranged between the bonding area 12 and the peripheral part (side face 10*c*) of the die pad 10 and in which the multiple holes (hollow part) 11 are formed. Moreover, although illustration of a plan view is omitted, as shown in FIG. 14, the stepped part 14 and the groove part 15 that were explained using FIG. 10 are formed over the undersurface 10*b* of the die pad 10.

The above-mentioned lead frame 20 is manufactured, for example, by a flow shown in FIG. 1. First, in a patterning process, a metal plate (its illustration is omitted) serving as a base member is prepared, and outer shapes of structural members (die pad 10, multiple leads 4, and tie bar 21) in the product formation area 20*a* shown in FIG. 13 are formed in the metal plate. Although the forming method is not limited in particular, it can be formed, for example, by a press working using a punch and a die, or by etching.

Next, the multiple holes 11 are formed over the upper surface 10*a* of the die pad 10 in the hollow part formation process. In detail, the multiple holes 11 are formed in the hollow part arrangement area 13 between the bonding area 12 and the chip mounting area 10*d*. Moreover, the multiple holes are formed also in the hollow part arrangement area 16 between the bonding area 12 and the peripheral part (side face 10*c*) of the die pad 10. As a method for forming the hole 11, it can be formed, for example, by an etching method using an etching mask or by the press working. Moreover, as explained using FIG. 10, in the case of forming the stepped part 14 and the groove part 15 on the undersurface 10*b* side of the die pad 10, they can be formed by this process. As a formation method of the stepped part 14 and the groove part 15, they can be formed, for example, by an etching method using an etching mask or the press working.

Next, in a surface roughening process, the surface roughness of the upper surface 10*a* is made coarse. As a method for making the surface roughness of the upper surface 10*a* coarse, a method for depositing a plated metal whose surface is roughened, i.e., a so-called roughening plating method can be used when forming the plated film, such as a nickel film. By the roughening plating method, the plated metal whose surface is roughened intentionally can be deposited by lowering a current density, a supply speed of a plating solution (metal ion), etc. at the time of electroplating. Moreover, at this time, in the case where the surface roughness of the upper surface 10*a* is made coarser than that of the undersurface 10*b*, the die pad is subjected to electroplating with the undersurface 10*b* side covered with an unillustrated mask. This makes it difficult for the metal surface whose surface is coarse to be formed on the undersurface 10*b* side, and therefore the undersurface 10*b* whose flatness is relatively higher than that of the upper surface 10*a* can be obtained.

Next, in an offset process, as shown in FIG. 14, a processing (offset processing) is performed so that a position (height) of the upper surface 10*a* of the die pad 10 may become a position lower than a position (height) of the lead 4 (inner lead part 4*a*). By a method of the offset process, the suspension leads 9 (refer to FIG. 13) can be offset (down set) by deforming them, for example, by performing the press working using a forming mold.

Incidentally, FIG. 11 shows a mode for carrying out the invention in which the offset process is performed after the surface roughening process. In this embodiment, improvement in producibility is aimed at by performing a batch processing on the lead frame 20 having a large number of product formation areas 20*a* as shown in FIG. 12. However, in the surface roughening process, if a position of the undersurface 10*b* of the die pad 10 varies, there will be an apprehension that a plated metal surface whose surface on the undersurface 10*b* side is coarse may be formed in some of product formation areas 20*a*. Hence, if the offset process is performed after the surface roughening process as shown in FIG. 11, the undersurface 10*b* whose flatness is higher than that of the upper surface 10*a* can be obtained.

However, as a modification, the surface roughening process can also be performed after performing the offset process beforehand. In this case, since there is no apprehension that the upper surface 10*a* of the die pad 10 is crushed by the press working, it can be processed with a strong pressure in the offset process.

2. Semiconductor Chip Mounting

Figure 15:
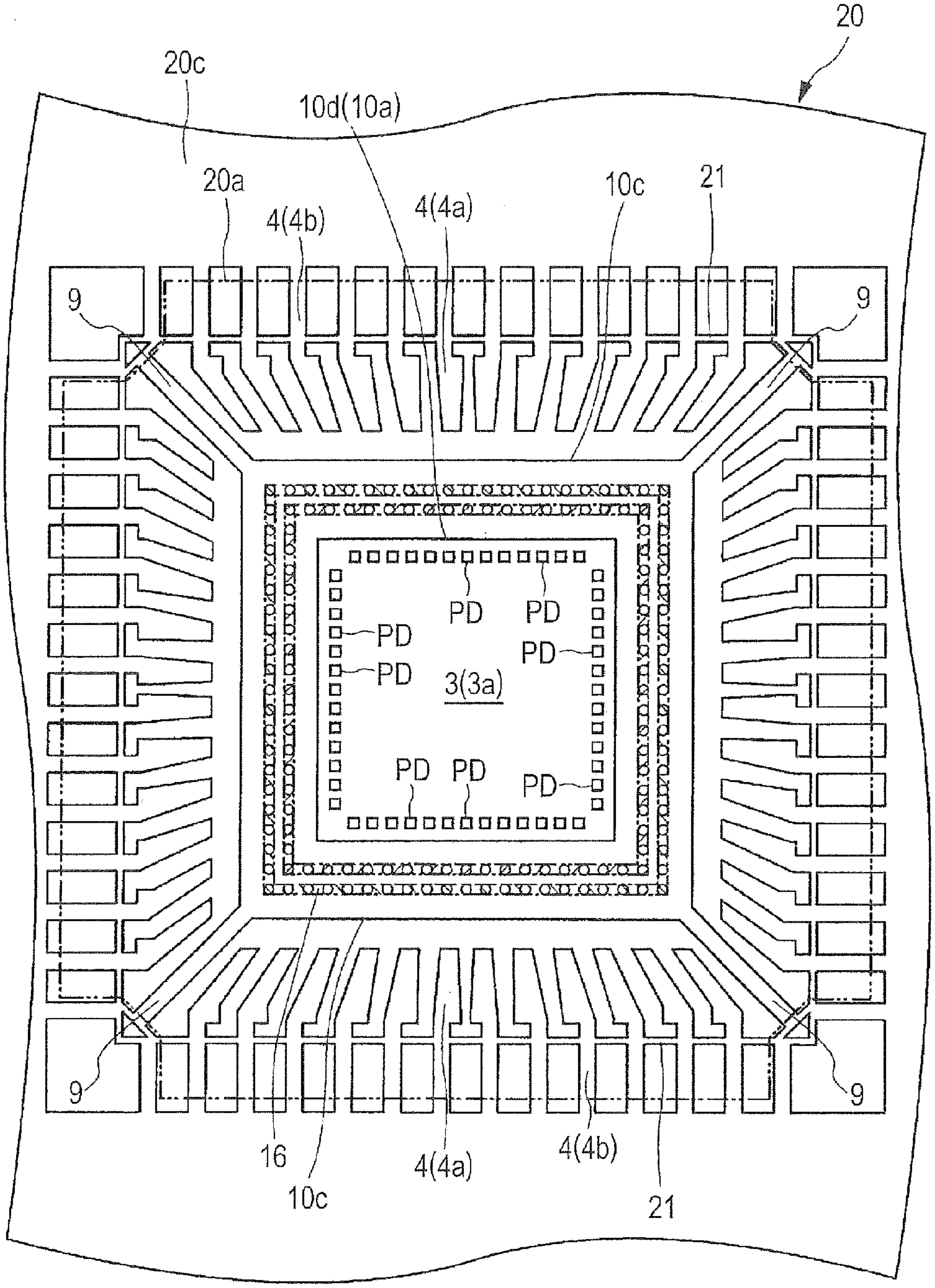
FIG. 15 is an enlarged plan view showing a state in which a semiconductor chip is mounted over the die pad shown in FIG. 13 though a bonding material.

Next, as the semiconductor chip mounting process shown in FIG. 11, the semiconductor chip 3 is mounted over the die pad 10 through the die bonding material 8. FIG. 15 is an enlarged plan view showing a state in which the semiconductor chip is mounted over the die pad shown in FIG. 13 through the bonding material, and FIG. 16 is an enlarged sectional views showing a state in which the semiconductor chip is mounted over the die pad shown in FIG. 14 through the bonding material.

Figure 16:
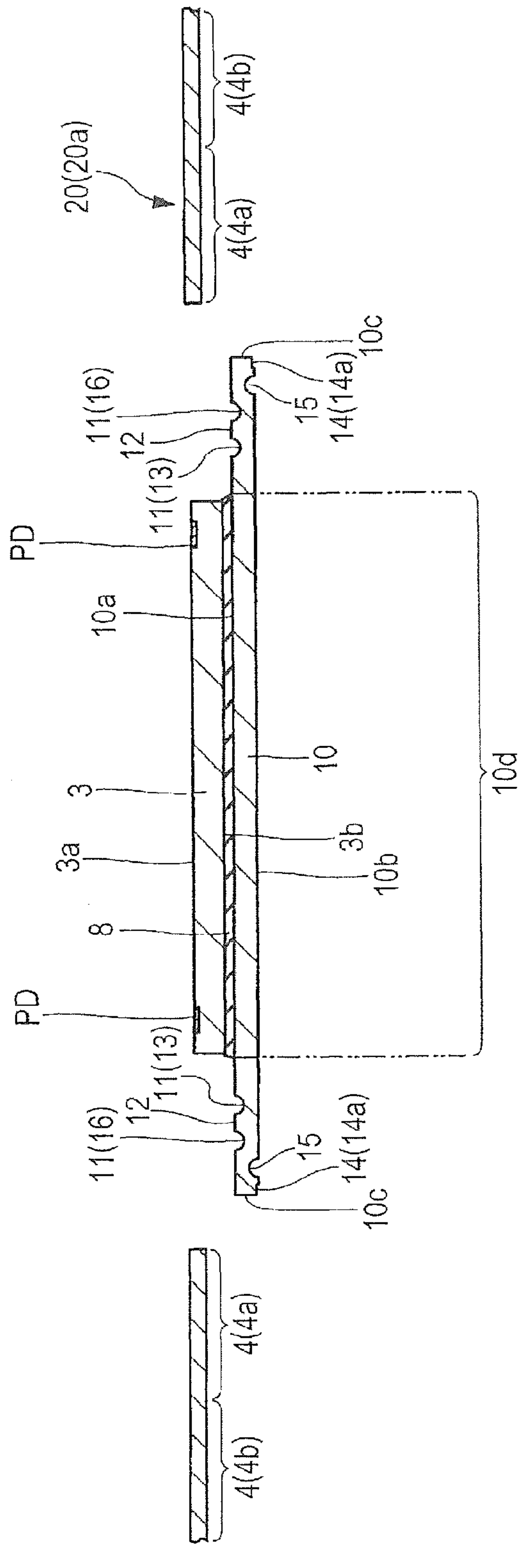
FIG. 16 is an enlarged sectional view showing a state in which a semiconductor chip is mounted over the die pad shown in FIG. 14 though the bonding material.

In this embodiment, as shown in FIG. 16, the semiconductor chip 3 is mounted by a so-called face-up mounting method whereby the reverse side 3*b* (surface opposite to the surface 3*a* over which the multiple pads PD are formed) of the semiconductor chip 3 is faced to the upper surface 10*a* of the die pad 10 as shown in FIG. 16. Moreover, as shown in FIG. 15, the semiconductor chip 3 is mounted in the central part of the die pad 10 so that each side of the surface 3*a* may be arranged along each side of the die pad 10.

In this embodiment, the semiconductor chip 3 is mounted, for example, through the die bonding material 8 that is a thermosetting resin of an epoxy system, and the die bonding material 8 is a paste material having mobility before curing (heat curing) it. When using the paste material as the die bonding material 8 like this, first, the die bonding material 8 is applied on the die pad 10, and subsequently the reverse side 3*b* of the semiconductor chip 3 is adhered to the upper surface 10*a* of the die pad 10. Then, the die bonding material 8 is cured (e.g., being subjected to a heat treatment) after the adhesion, which fixes the semiconductor chip 3 over the die pad 10 through the die bonding material 8 as shown in FIG. 16.

Incidentally, although in this embodiment, the mode for carrying out the invention in which the paste material comprised of the thermosetting resin was used as the die bonding material 8 was explained, various modifications are applicable. For example, it may be all right that an adhesive that is a tape member (film member) having adhesive layers on its both sides instead of a paste material is adhered to the reverse side 3*b* of the semiconductor chip 3 beforehand and the semiconductor chip 3 is mounted over the die pad 10 through the tape member.

Moreover, in this embodiment, the semiconductor chip 3 is mounted with the whole of the upper surface 10*a* including the chip mounting area 10*d* roughened. For this reason, since an area of the adhesion interface of the die bonding material 8 and the die pad 10 increases, the exfoliation of the die bonding material 8 can be inhibited. Therefore, from the viewpoint of stopping the development of exfoliation, it does not matter whether the surface of the chip mounting area 10*d* is roughened. However, it is desirable from the viewpoint of inhibiting the exfoliation of the die bonding material 8 and the die pad 10 that the surface roughness of the chip mounting area 10*d* should be made coarser than that of the undersurface 10*b*.

3. Wire-Bonding Process

Figure 17:
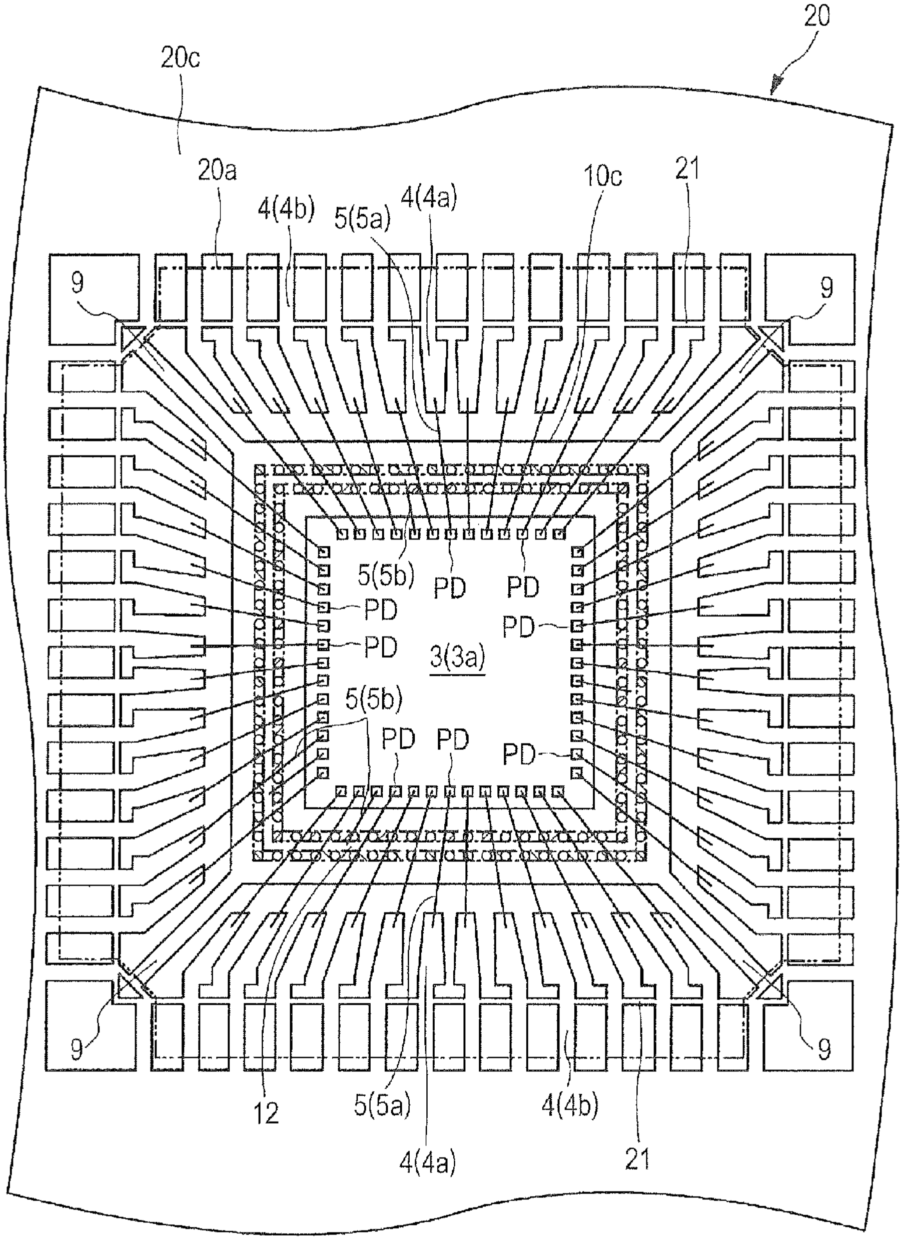
FIG. 17 is an enlarged plan view showing a state in which the semiconductor chip shown in FIG. 15, multiple leads, and the die pad are electrically coupled through wires.
Figure 18:
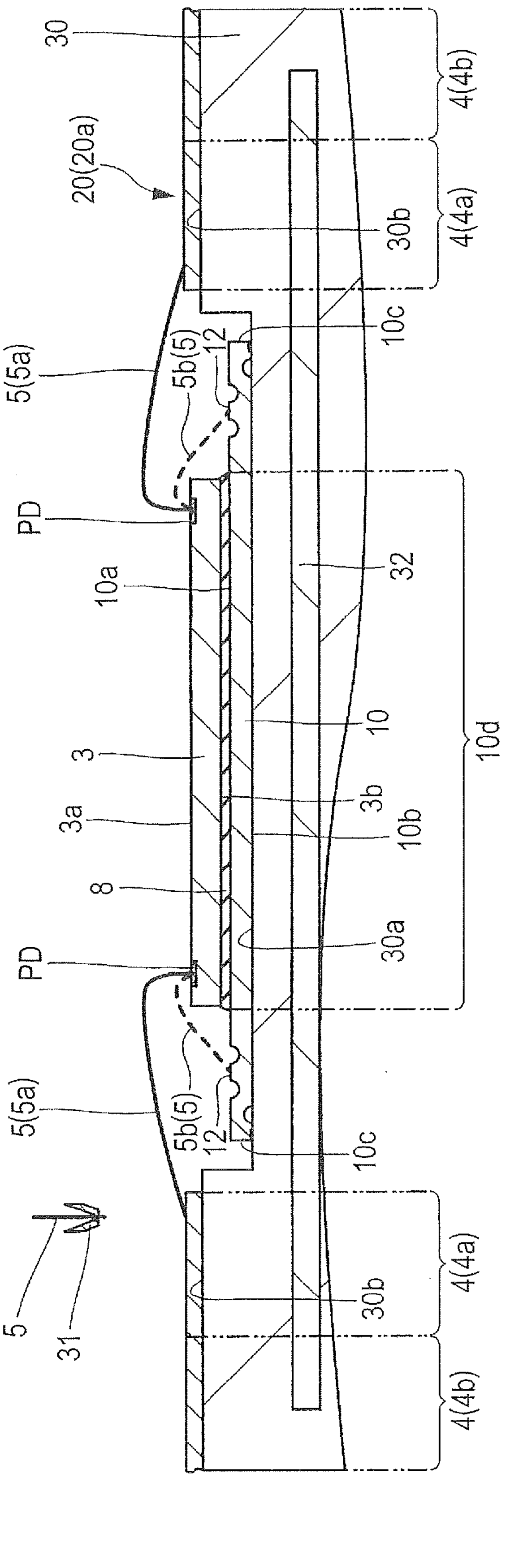
FIG. 18 is an enlarged sectional view showing a state in which the semiconductor chip shown in FIG. 16 and the multiple leads are electrically coupled through the wires.

Next, as a wire-bonding process shown in FIG. 11, the multiple pads PD of the semiconductor chip 3 and the multiple leads 4 are electrically coupled through the multiple wires (conductive members) 5*a*, respectively, as shown in FIG. 17 and FIG. 18. Moreover, in this process, the semiconductor chip 3 and the die pad 10 are electrically coupled through the wire 5*b*. FIG. 17 is an enlarged plan view showing a state in which the semiconductor chip shown in FIG. 15 is electrically coupled with the multiple leads and the die pad through wires, and FIG. 18 is an enlarged sectional view showing a state in which the semiconductor chip shown in FIG. 16 is electrically coupled with the multiple leads through the wires.

In this process, as shown, for example, in FIG. 18, the lead frame 20 such that the semiconductor chip 3 is mounted over the die pad 10 of each product formation area 20*a* is placed over a heat stage (susceptor) 30. Then, the multiple pads PD of the semiconductor chip 3 and the multiple leads 4 are electrically coupled through the multiple wires 5*a*. Moreover, in this process, a part of each of the multiple pads PD and the bonding area 12 of the die pad 10 are electrically coupled through the wire 5*b*. The wire 5 is comprised of a metal, and in this embodiment, is comprised, for example, of gold (Au).

The wires 5 are bonded by a so-called nail head bonding method whereby the wire 5 is supplied, for example, through a capillary 31 shown in FIG. 18 and the wire 5 is bonded using an ultrasonic wave and thermocompression. In this embodiment, in order to improve the bonding strength, the pad PD, the lead 4, and the wire bonding area of the die pad 10 that are objects to be bonded are bonded in a state in which each of them is heated. A heat source for supplying heat to the pad PD, the leads 4, and the die pad 10 is a heater 32 built in the heat stage 30, for example. In detail, by bringing a die pad supporting surface 30*a* of the heat stage 30 and the undersurface 10*b* of the die pad 10 into adhesion, the die pad 10 and the pad PD that the semiconductor chip 3 has are heated from the undersurface 10*b* side of the die pad 10. Moreover, by bringing a die lead supporting surface 30*b* of the heat stage 30 and the undersurface of the lead 4 into adhesion, the upper surface of the lead 4 (surface over which the wire bonding area is arranged) is heated from the undersurface side of the lead 4. Thus, the bonding strength of the wire 5 and the object to be bonded can be improved by heating the wire bonding areas of the pad PD, the lead 4, and the die pad 10 that are members to be bonded.

Here, in the case where the undersurface 10*b* of the die pad 10 is roughened similarly with the upper surface 10*a*, since a contact area of the die pad supporting surface 30*a* of the heat stage 30 and the die pad 10 decreases, a thermal efficiency in heating the die pad 10 falls. However, in this embodiment, as described above, since the roughening plating film is hard to be formed over the undersurface 10*b* of the die pad 10, the undersurface 10*b* has become a plane flatter than the upper surface 10*a*. Therefore, this embodiment can inhibit a fall of the heating efficiency due to a decrease of the contact area of the die pad supporting surface 30*a* of the heat stage 30 and the die pad 10.

Moreover, in this embodiment, surface roughness of the bonding area 12 provided over the upper surface 10*a* of the die pad 10 is coarser than that of the undersurface 10*b*. Therefore, since a bonding area at the time of bonding the wire 5 and the bonding area 12 increases, the bonding strength can further be improved.

4. Sealed Body Formation Process

Figure 19:
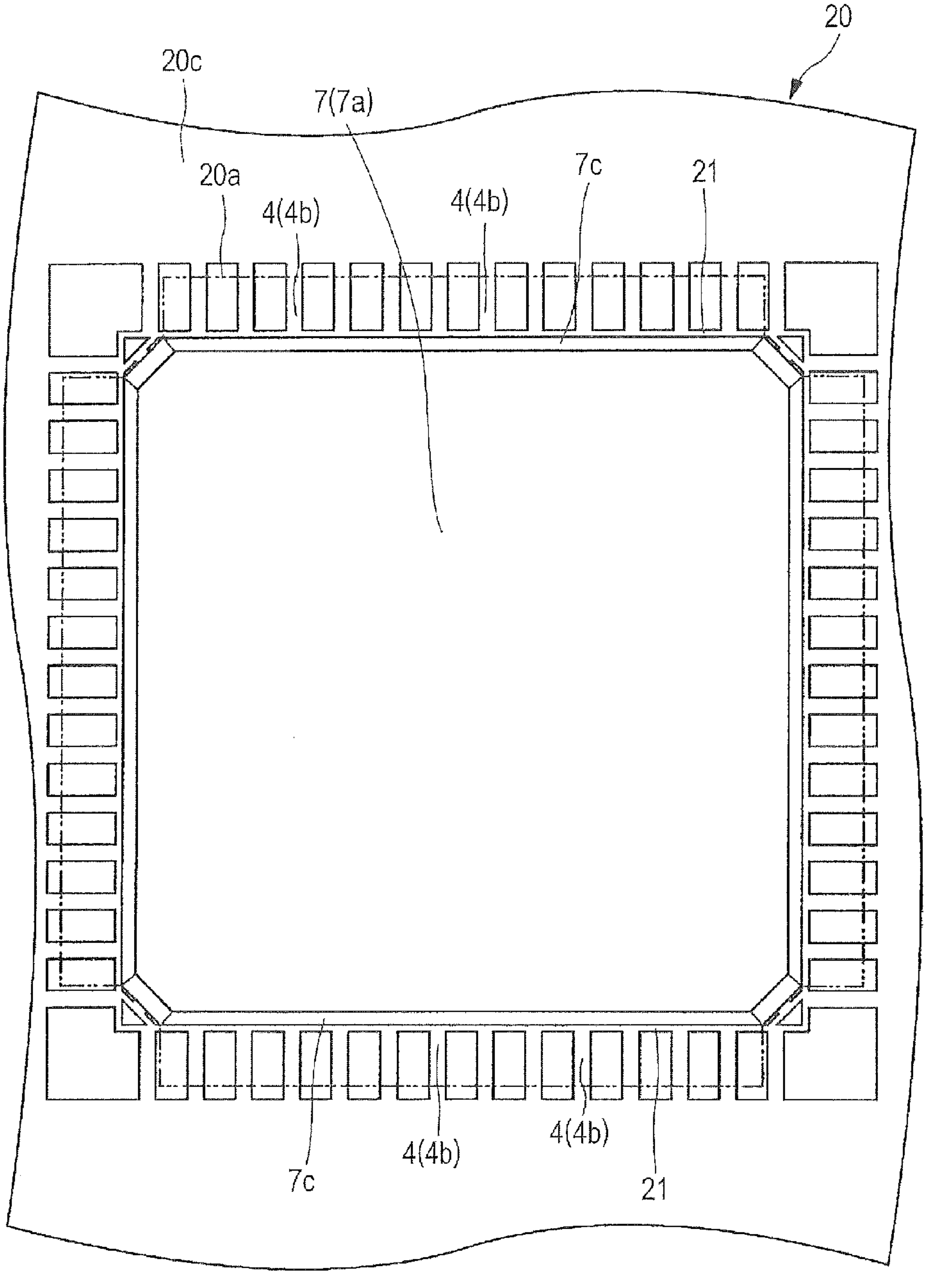
FIG. 19 is an enlarged plan view showing a state in which the sealed body is formed in a product formation area of the lead frame shown in FIG. 17.
Figure 20:
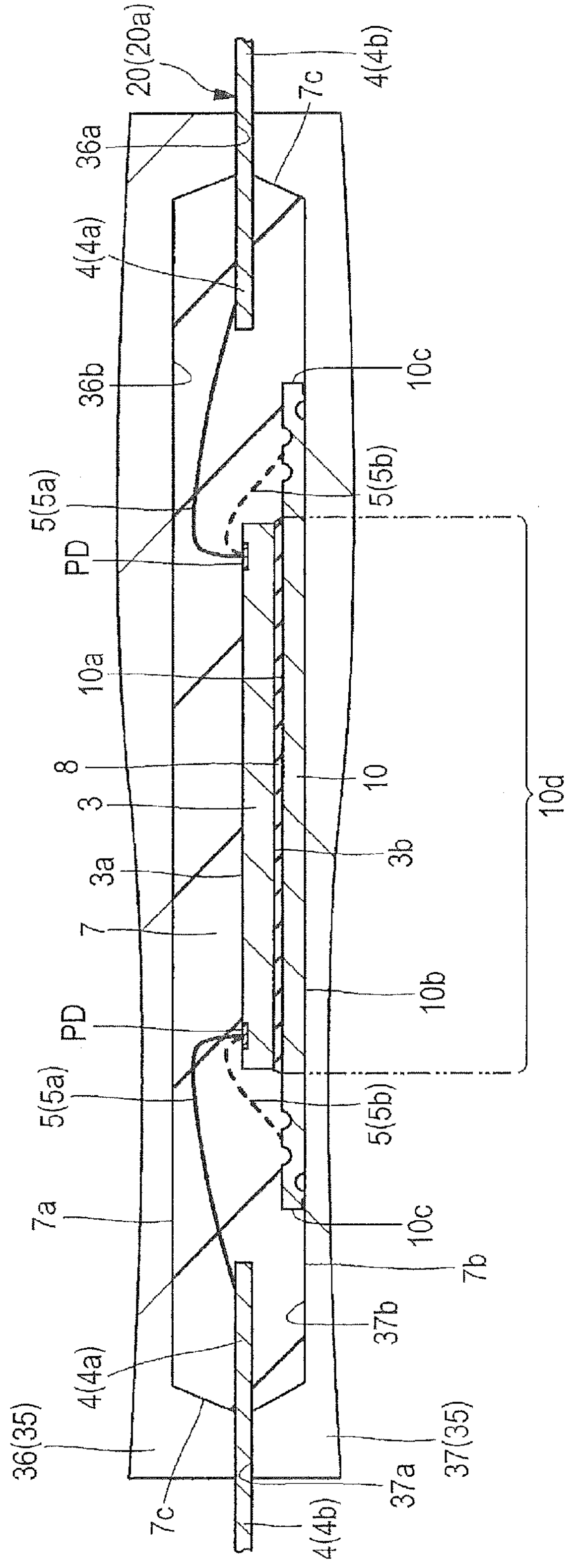
FIG. 20 is an enlarged sectional view showing a state in which the sealed body is formed in a product formation area of the lead frame shown in FIG. 18.
Figure 21:
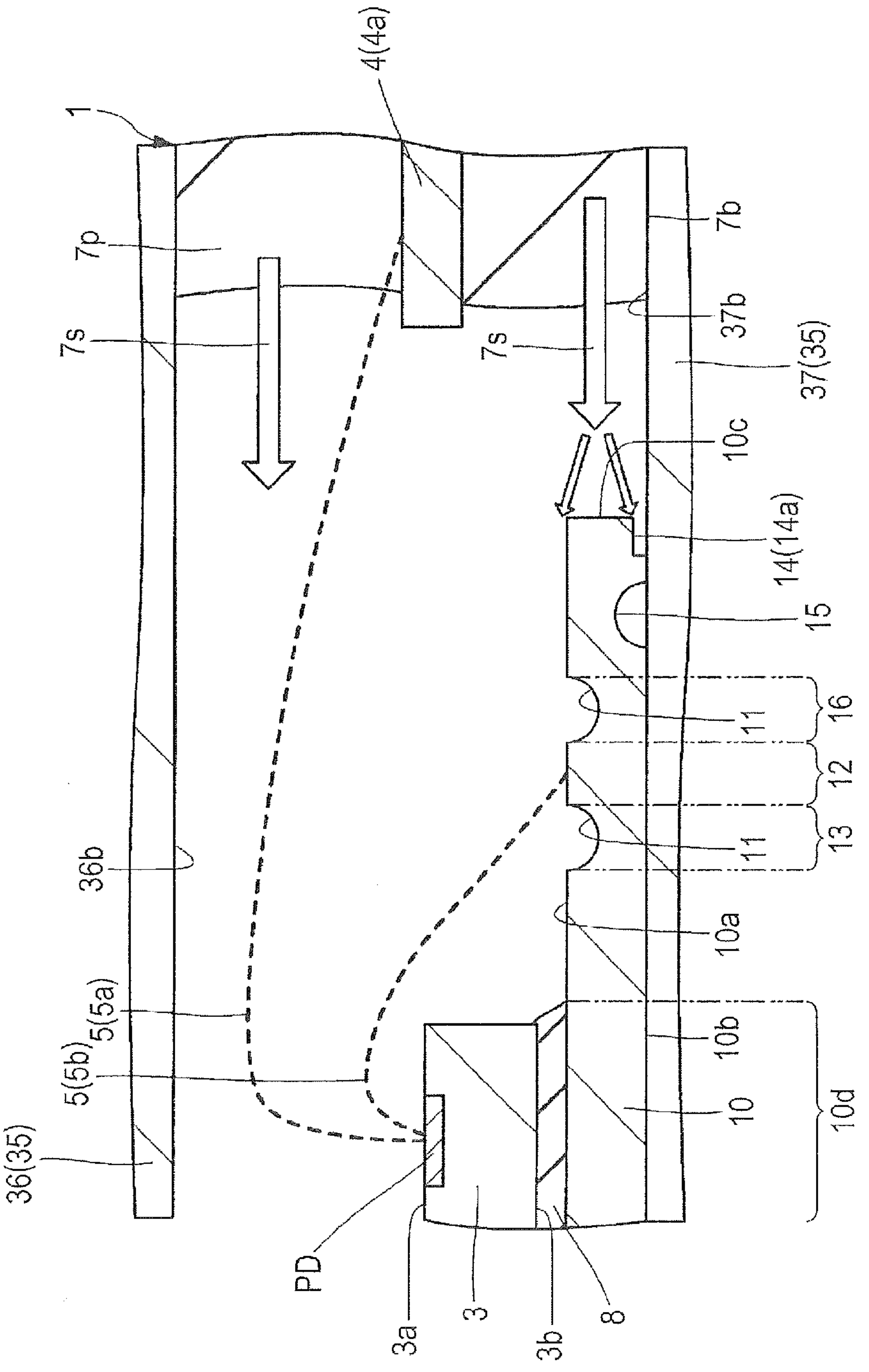
FIG. 21 is an explanatory diagram schematically showing a flow of a resin for sealing in a cross section in which a part of FIG. 20 is enlarged.

Next, as the sealed body formation process shown in FIG. 11, the sealed body (resin body) 7 is formed, and the semiconductor chip 3 (refer to FIG. 20), the multiple wires 5 (refer to FIG. 20), the inner lead part of the lead 4, and the upper surface 10*a* (refer to FIG. 20) of the die pad 10 (refer to FIG. 20) are sealed as shown in FIG. 19 and FIG. 20. FIG. 19 is an enlarged plan view showing a state in which the sealed body is formed in the product formation area of the lead frame shown in FIG. 17, and FIG. 20 is an enlarged sectional view showing a state in which the sealed body is formed in the product formation area of the lead frame shown in FIG. 18. Moreover, FIG. 21 is an explanatory diagram schematically showing a flow of the resin for sealing in a cross section in which a part of FIG. 20 is enlarged.

In this step, first, a forming mold 35 that is comprised of an upper mold 36 having a mold surface (first mold surface) 36*a*, and a cavity (concave part) 36*b* formed on this mold surface 36*a* and a lower mold 37 having a mold surface (second mold surface) 37*a* facing the mold surface 36*a* of the upper mold 36 and a cavity (concave part) 37*b* formed on this mold surface 37*a* is prepared as shown in FIG. 20. Then, the lead frame 20 that is subjected to the wire-bonding process is arranged inside the forming mold 35 (between the upper mold 36 and the lower mold 37) so that the semiconductor chip 3 and the die pad 10 may be located in the cavity 36*b* of the upper mold 36 and the cavity 37*b* of the lower mold 37. Here, in this embodiment, in order to expose the undersurface 10*b* of the die pad 10 on the undersurface 7*b* side of the sealed body 7, the undersurface 10*b* is abutted to a bottom of the cavity 37*b* of the lower mold 37.

Next, the lead frame 20 is clamped with the upper mold 36 and the lower mold 37. At this time, when clamping the lead frame 20, parts of the multiple leads 4 (at least parts that overlap the tie bar 21 shown in FIG. 19) formed in the lead frame 20 are clamped. Then, one part of the lead 4 (inner lead part 4*a*) is arranged in the cavities 36*b*, 37*b*, and the other part (outer lead part 4*b*) of the lead 4 is clamped by the forming mold 35 outside the cavities 36*b*, 37*b*. Moreover, the cavity 37*b* is formed with its depth (a length from the height of the mold surface 37*a* to the height of the bottom of the cavity 37*b*) being in accordance with an amount of offset of the die pad 10 (so that the amount of offset and the depth of the cavity 37*b* may become equal). For this reason, when the lead frame 20 is clamped with the upper mold 36 and the lower mold 37, the undersurface 10*b* of the die pad 10 is brought into adhesion with the bottom of the cavity 37*b* of the lower mold 37.

Next, in a state in which the lead frame 20 is being clamped with the upper mold 36 and the lower mold 37, a resin (e.g., a resin softened by heating) 7*p* (refer to FIG. 21) is supplied into a space formed by overlapping the cavity 36*b* of the upper mold 36 and the cavity 37*b* of the lower mold 37, and the semiconductor chip 3, the multiple wires 5, the part of each of the multiple leads 4 (inner lead part 4*a*), and the upper surface 10*a* of the die pad 10 are sealed with this resin 7*p* for sealing. Then, the sealed body 7 is formed by heat curing the supplied resin 7*p*. Such a sealing method is called a transfer mold method.

In the transfer mold method, the resin is supplied (injected) into the insides of the cavities 36*b*, 37*b* from a supply part (gate part), and residual gas and excessive resin 7*p* (refer to FIG. 21) in the cavities 36*b*, 37*b* are discharged from a discharge part (vent part). Classifying the transfer mold method by a position of the supply part to the cavities 36*b*, 37*b*, it can be divided roughly into a top gate method where the supply part is arranged in an upper part of the cavity 36*b*, and a side gate method where the supply part is arranged on the side face side of the cavities 36*b*, 37*b*. In this embodiment, the side gate method that is advantageous in the viewpoint of miniaturization of the forming mold or ease of maintenance of the forming mold is applied.

In this embodiment, as shown in FIG. 20, the sealed body 7 is formed so that the undersurface 10*b* of the die pad 10 may be exposed, but as described above, when exposing the die pad 10, the excessive resin 7*p* (refer to FIG. 21) turns its direction to the undersurface 10*b* side of the die pad 10, and the resin burr is easily formed. Then, if the resin burr occurs, a need for adding the resin burr removal process will arise, and an interstice will become easy to be formed between the sealed body 7 and the undersurface 10*b* of the die pad 10. For this reason, moisture invades easily from an interstice between the sealed body 7 and the die pad 10. That is, invasion of moisture from the outside of the package can be inhibited by inhibiting the occurrence of the resin burr.

Hence, this embodiment is configured so that the stepped part 14 that ranges to the undersurface 10*b* is provided over the peripheral part of the undersurface 10*b* of the die pad 10 as shown in FIG. 21. In other words, the die pad 10 has the undersurface (surface, stepped surface) 14*a* that ranges to the side face 10*c* inside the side face 10*c*, and the undersurface 14*a* is located at the height between the upper surface 10*a* and the undersurface 10*b*. Moreover, as described above, the stepped part 14 is formed continuously so as to surround the peripheral part of the undersurface 10*b* of the die pad 10 all over the whole periphery. Moreover, in the die pad 10, the groove part 15 is provided between the central part and the stepped part of the undersurface 10*b* of the die pad 10. The groove part 15 is formed inside the stepped part 14 (on the central part side of the undersurface 10*b*), and is continuously formed so as to surround the periphery of the central part of the undersurface 10*b* all over the whole periphery.

As shown by an arrow 7*s* in FIG. 21, some of the resin 7*p* supplied into the cavities 36*b*, 37*b* hits the side face 10*c* of the die pad 10, and changes its direction of movement. However, in the case of not providing the stepped part 14, a supply pressure of the resin 7*p* concentrates on a lower end part (boundary with the undersurface 10*b*) of the side face 10*c*, and acts as a power of lifting the peripheral part of the die pad upward. Here, if the stepped part 14 is provided as in this embodiment, since the supply pressure of the resin 7*p* can be dispersed to the surroundings, it will become possible to inhibit the deformation of the die pad 10 due to the supply pressure of the resin 7*p*.

However, according to an examination of the inventors of this application, it has been found that the supply pressure of the resin 7*p* is inhibited from concentrating locally by providing the stepped part 14, but some of the resin 7*p* may enter into the undersurface 10*b* side of the die pad 10 after coming over the stepped part 14. Hence, in this embodiment, the semiconductor device is configured to have the groove part 15 provided between the central part and the stepped part 14 of the undersurface 10*b* of the die pad 10. The groove part 15 formed inside the stepped part 14 functions as the dam part for damming up the resin that invaded toward the central part of the die pad 10 after coming over the stepped part 14. Therefore, even if some of the resin 7*p* comes over the stepped part 14, since the resin 7*p* will be embedded in the groove part 15, invasion of the resin 7*p* will be dammed up by the groove part 15.

Next, the sealed body 7 shown in FIG. 19 and FIG. 20 is obtained by curing the resin 7*p* supplied into the cavities 36*b*, 37*b*. If a thermosetting resin, for example, an epoxy system resin, etc., is used for the resin 7*p*, it can be hardened by giving a heat treatment.

5. Outer Plating Process

Figure 22:
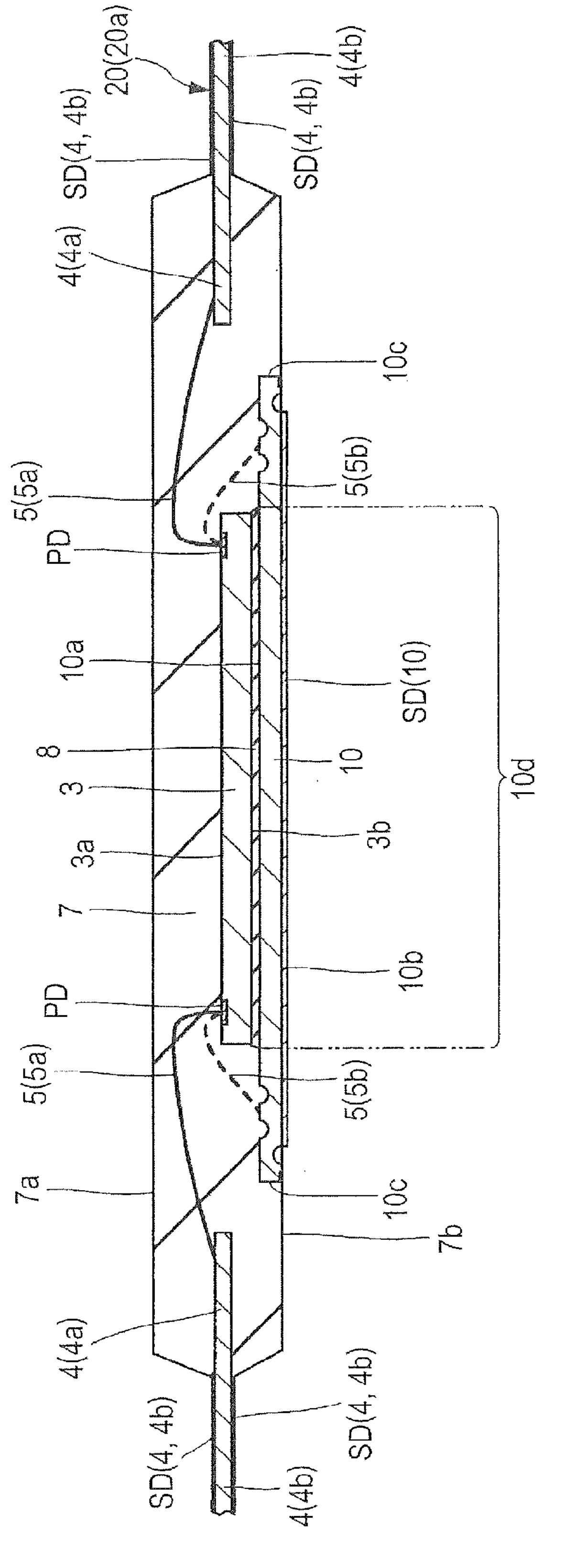
FIG. 22 is an enlarged sectional view showing a state in which a metal film (outer plating film, solder film) is formed over an exposed surface of the multiple leads and the die pad that are exposed from the sealed body shown in FIG. 20.

Next, as an outer plating process shown in FIG. 11, the metal film (outer plating film, solder film) SD is formed over exposed surfaces (outer lead parts 4*b*) of the multiple leads 4 that are exposed from the sealed body 7 as shown in FIG. 22. FIG. 22 is an enlarged sectional view showing a state in which a metal film (outer plating film, solder film) is formed over the exposed surfaces of the multiple leads and the die pad that are exposed from the sealed body shown in FIG. 20.

In this process, the lead frame 20 that is a workpiece to be plated is placed in a plating tub (its illustration is omitted) containing the plating solution (its illustration is omitted), and the metal film SD is formed, for example, by an electrolytic plating method. According to this electrolytic plating method, it is possible to form the outer plating film over every area of the lead frame 20 that is exposed from the sealed body 7 collectively. Therefore, the metal film SD is formed so as to cover the exposed part of the die pad 10 in addition to the exposed part of the lead 4. Moreover, the metal film SD is formed also in the frame part 20*c*.

6. Lead Forming Process

Figure 23:
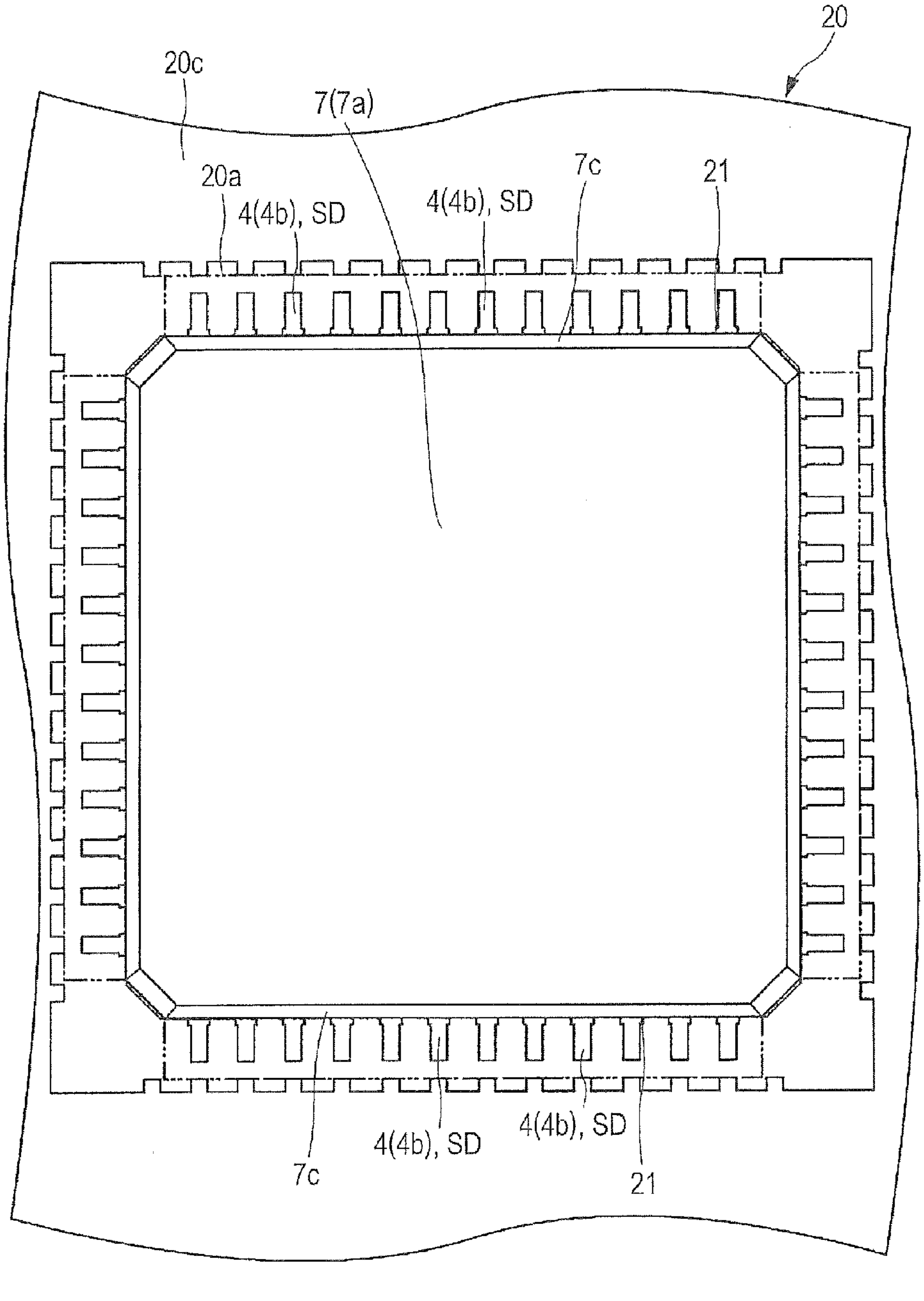
FIG. 23 is an enlarged plan view showing a state in which the multiple leads over which metal films are formed in an outer plating process shown in FIG. 11 are cut from a frame part of the lead frame, and are formed into shapes.

Next, as a lead forming process, a link part of the multiple leads 4 linked to the frame part 20*c* of the lead frame 20 is cut, and subsequently the leads are formed by being subjected to bending. FIG. 23 is an enlarged plan view showing a state in which the multiple leads over which the metal film was formed in the outer plating process shown in FIG. 11 are formed by being cut from the frame part of the lead frame. Incidentally, since a sectional view to FIG. 23 is the same as that of FIG. 4, its illustration is omitted.

In this process, first, the multiple leads 4 that are linked to the frame part 20*c*, respectively, to be one body are cut at the link part, and are made to be mutually independent members, respectively (lead cutting process). Incidentally, tie bar 21 that links the multiple leads 4 is cut between the adjacent leads after a sealed body process and before the outer plating process (tie bar cutting process). Although this tie bar cutting process can also be performed after the outer plating process, cutting the tie bar 21 before the outer plating process forms the metal film SD also over a cutting plane. Therefore, it is desirable to cut the tie bar 21 before the outer plating process from the viewpoint of improving the wettability of solder at the time of mounting the semiconductor device 1 shown in FIG. 1.

In the tie bar cutting process and the lead cutting process, the lead 4 is cut by pressing with a die (support member; its illustration is omitted) placed on one plane side (e.g., the undersurface) of the lead frame 20 and a punch (cutting blade; its illustration is omitted) placed on the other plane side (e.g., the upper surface), respectively. An end part of the lead 4 thus cut by the press working has a substantially flat cutting plane and the base material of the lead 4 is exposed from the metal film SD in the cutting plane. By this process, the multiple leads 4 become independent members that are each separated.

Next, the multiple leads 4 as cut are formed by being subjected to the bending (bending process). In this embodiment, for example, the outer lead part 4*b* is formed into the shape of a gull wing as shown in FIG. 4. Moreover, if needed, a process of further cutting a tip of the lead 4 (outer lead part 4*b*) to adjust the length of the lead 4 may be performed.

7. Dicing-into-Pieces Process

Figure 24:
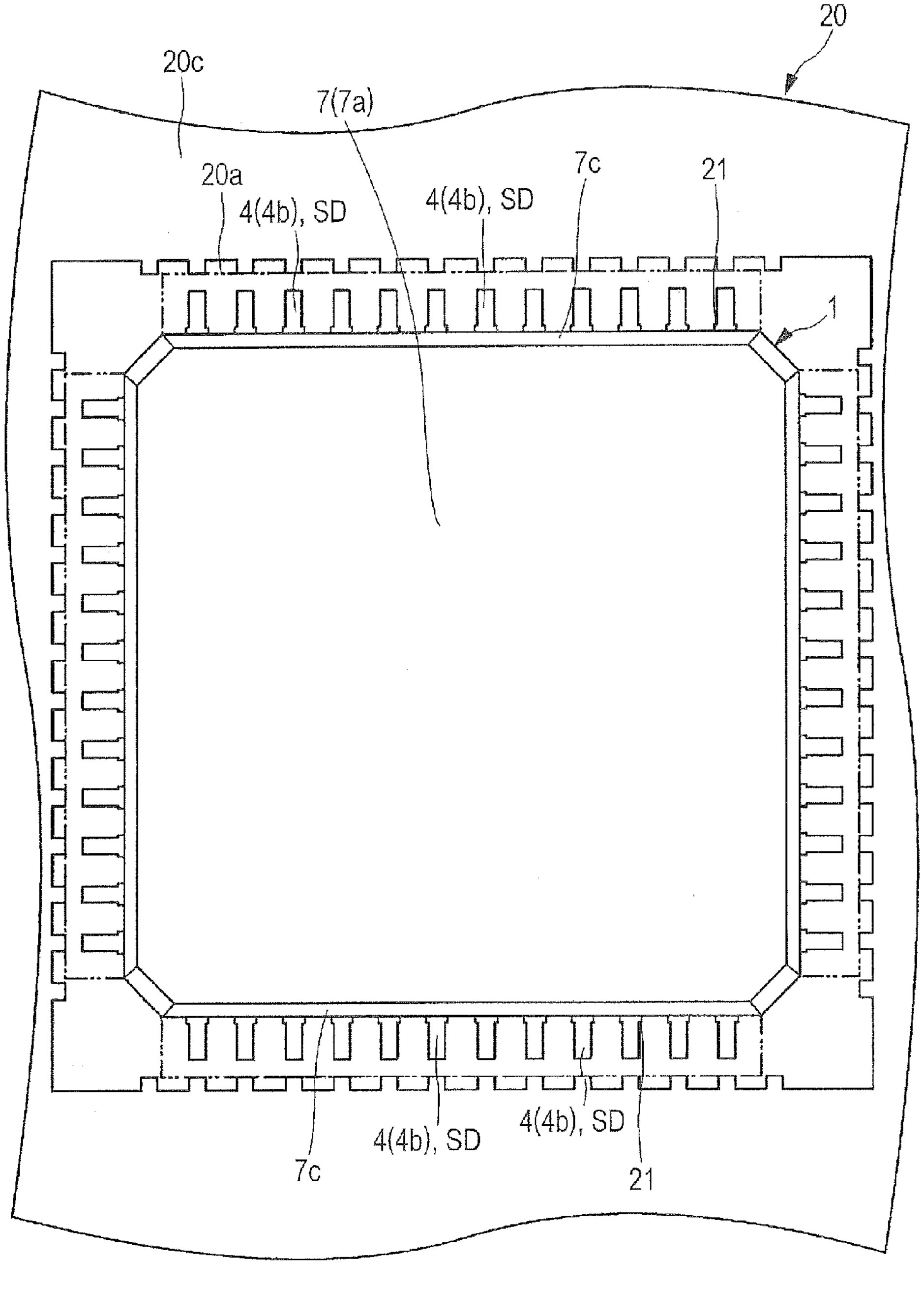
FIG. 24 is an enlarged plan view showing a state in which suspension leads of the lead frame shown in FIG. 23 are cut and separated from the frame part (dam part)

Next, as a dicing-into-pieces process shown in FIG. 11, the multiple suspension leads linked to the frame part 20*c* are cut so that they are diced into pieces in every product formation area 20*a* to attain the multiple semiconductor devices 1. FIG. 24 is an enlarged plan view showing a state in which the suspension leads of the lead frame shown in FIG. 23 are cut and separated from the frame part (dam part).

Although a dicing-into-pieces method is not limited in particular, a method for cutting it by press working using an unillustrated cutting mold can be applied like the above-mentioned lead cutting process. After this process, required inspections and test, such as a visual inspection and an electric test, are performed and accepted products serve as the semiconductor devices 1 that are finished products shown in FIG. 1 to FIG. 10. Then, the semiconductor device 1 is shipped or installed over an unillustrated mounted substrate.

<Modification>

Although in the foregoing, the invention made by the inventors of this application was specifically explained based on the embodiments, the present invention is not limited to the embodiments and it goes without saying that it can be modified within a range that does not deviate from a gist of the invention.

Figure 25:
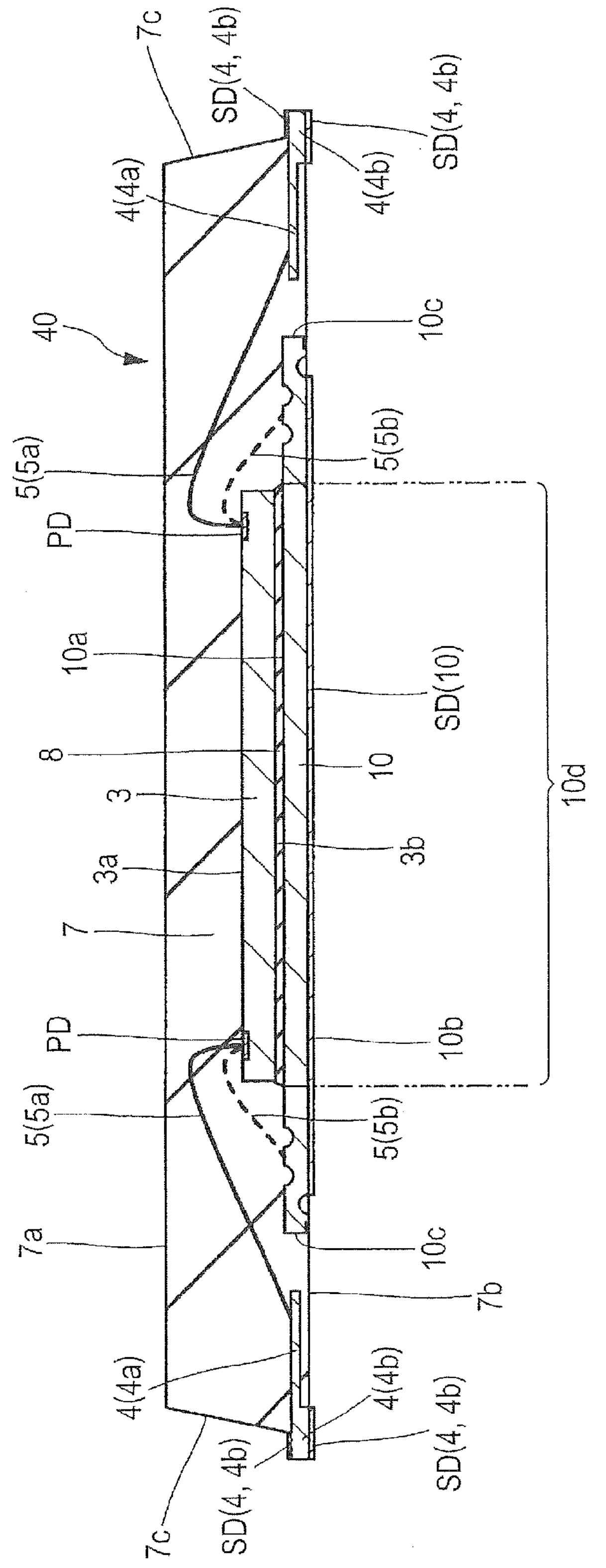
FIG. 25 is a sectional view showing a semiconductor device that is a modification of FIG. 4.

For example, in the embodiment, the semiconductor package that was explained by taking the QFP type semiconductor device as an example of the semiconductor package such that the undersurface 10*b* of the die pad 10 was exposed and was applied is not limited to be of the QFP type. For example, the semiconductor package can be applied to a semiconductor device 40 of a QFN (Quad Flat Non-leaded package) type such that a part of each of the multiple leads 4 is exposed over the undersurface of the sealed body 7 as shown in FIG. 25. FIG. 25 is a sectional view showing a semiconductor device that is a modification to FIG. 4. Moreover, FIG. 26 is an enlarged sectional view of a part of the semiconductor device shown in FIG. 25, and serves as a modification to FIG. 9.

Figure 26:
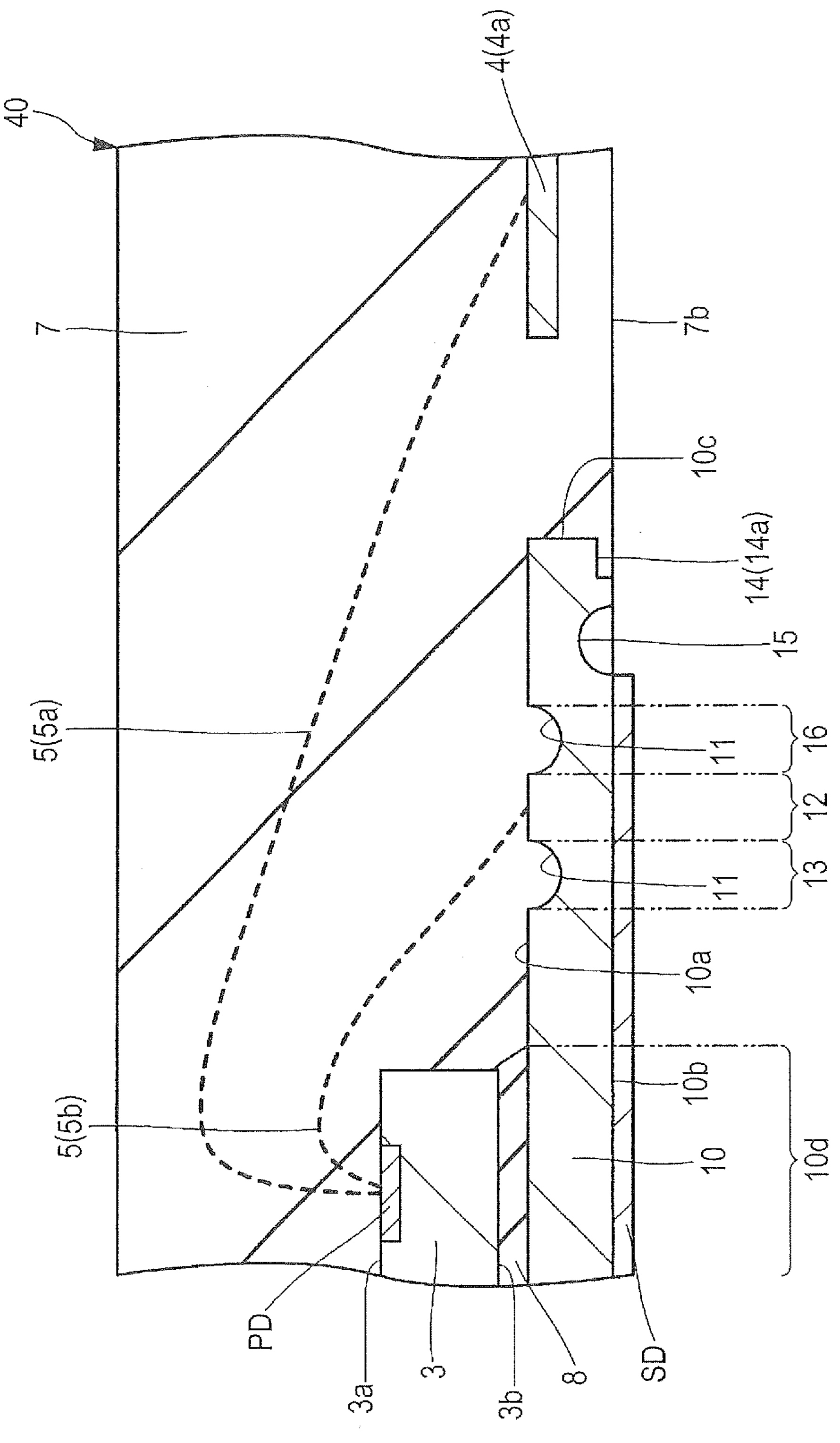
FIG. 26 is an enlarged sectional view of a part of the semiconductor device shown in FIG. 25.

The QFN-type semiconductor device 40 shown in FIG. 25 and FIG. 26 differs from the semiconductor device 1 shown in FIG. 4 in points that a position of the die pad 10 is not offset, but is arranged at the same position as the lead 4 and the multiple leads 4 are exposed from the underside 7*b* of the sealed body 7. Other points are the same as those of the semiconductor device 1 explained in the above-mentioned embodiment. Therefore, as shown in FIG. 26, application of respective configurations of the die pad 10 explained in the above-mentioned embodiment makes it possible to attain respective effects explained with the semiconductor device 1.

Moreover, in the embodiment, the mode for carrying out the invention in which the multiple holes are formed in each of the hollow part arrangement areas 13, 16 of the upper surface 10*a* of the die pad 10, respectively. However, as a modification, grooves (hollow parts) 17 can be formed in the hollow part arrangement areas 13, 16 like a semiconductor device 41 shown in FIG. 27, respectively. It is more desirable to form the groove 17 from the viewpoint of stopping certainly the development of exfoliation of the sealed body 7 (refer to FIG. 9) and the die pad 10.

Figure 27:
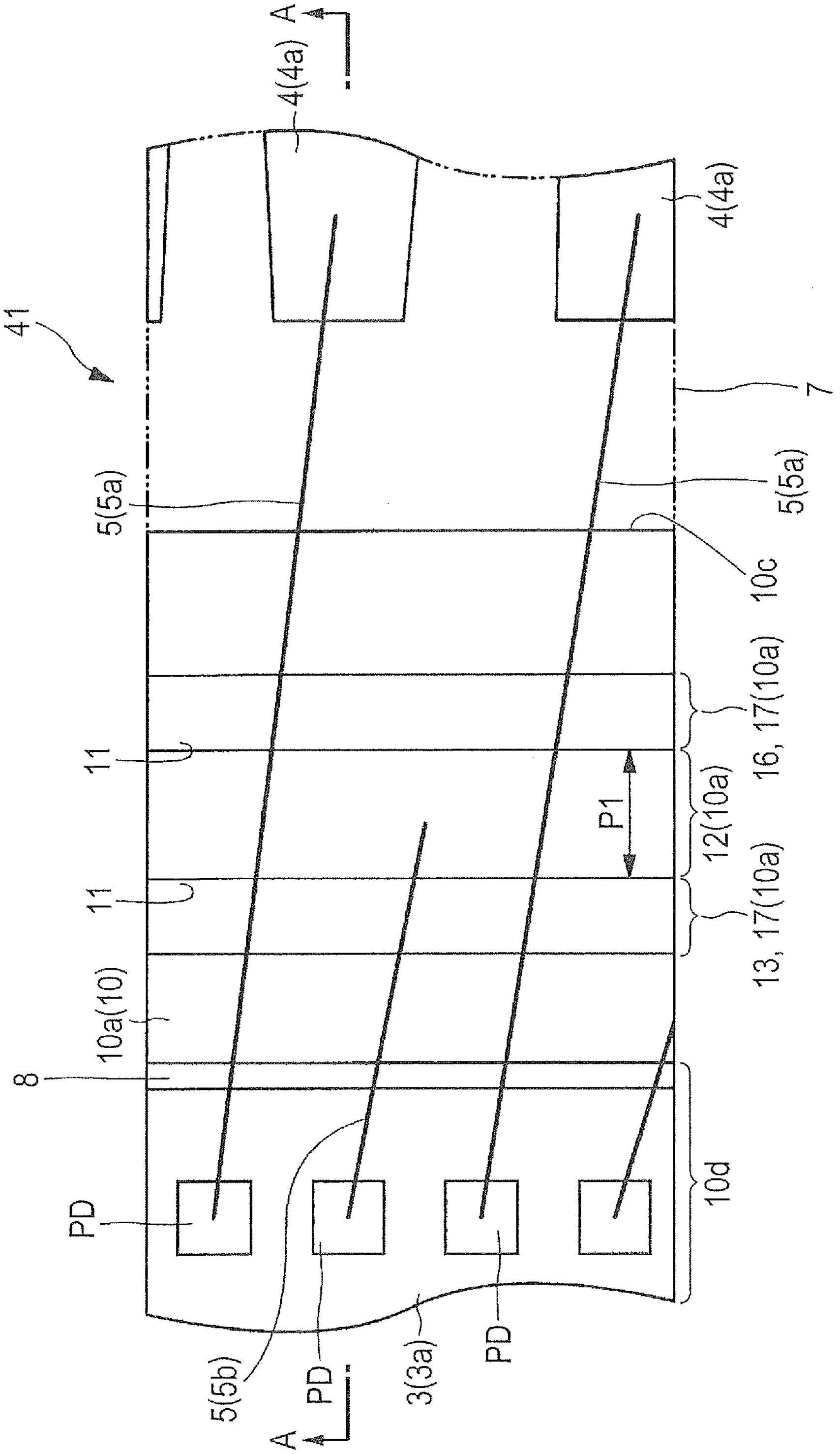
FIG. 27 is an enlarged plan view showing a semiconductor device that is a modification of FIG. 8.

However, when forming the grooves 17 in both of the hollow part arrangement areas 13, 16 as shown in FIG. 27, it is necessary to widen a width (arrangement space of the hollow part arrangement areas 13, 16) P1 of the bonding area 12 to which the wire 5*b* is bonded so that the wire 5*b* may not be bonded in the groove 17. On the other hand, in the case where the multiple holes 11 are formed in the hollow part arrangement areas 13, 16, respectively as shown in FIG. 8, the wire 5*b* can be bonded in an area surrounded by the adjacent holes 11. For this reason, a width (arrangement space of the hollow part arrangement areas 13, 16) P2 of the bonding area 12 in which the wire 5*b* is bonded can be narrowed.

That is, from the viewpoint of making the plane area of the die pad 10 small to attain miniaturization of the semiconductor device, a mode in which the multiple holes 11 are formed in each of the hollow part arrangement areas 13, 16, respectively, as shown in FIG. 8 is desirable. Alternatively, although illustration is omitted, it is desirable to form the multiple holes 11 in either of the hollow part arrangement areas 13, 16. Incidentally, it goes without saying that the above-mentioned modification is applicable to the QFN type semiconductor device 40 explained using FIG. 25 and FIG. 26.

Figure 28:
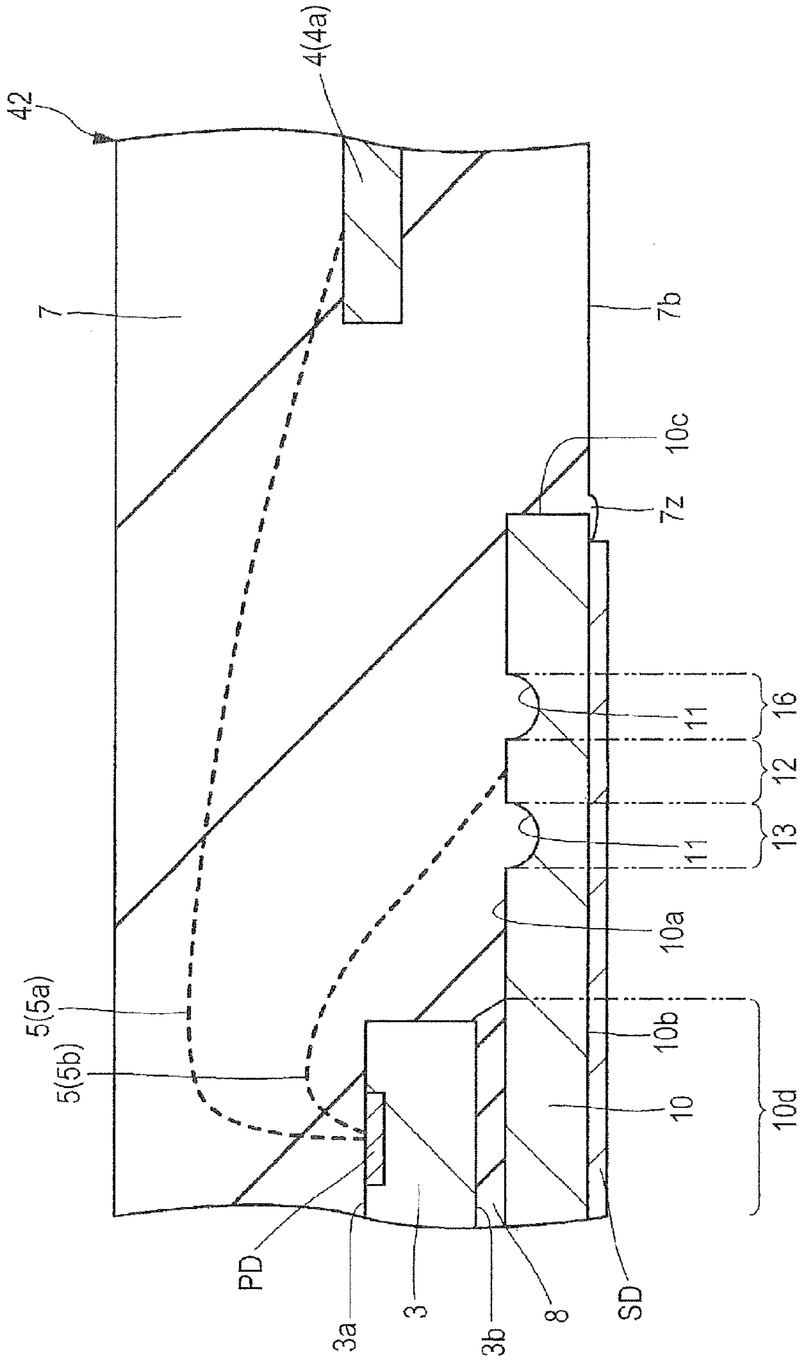
FIG. 28 is an enlarged sectional view showing a semiconductor device that is an other modification of FIG. 9.
Figure 29:
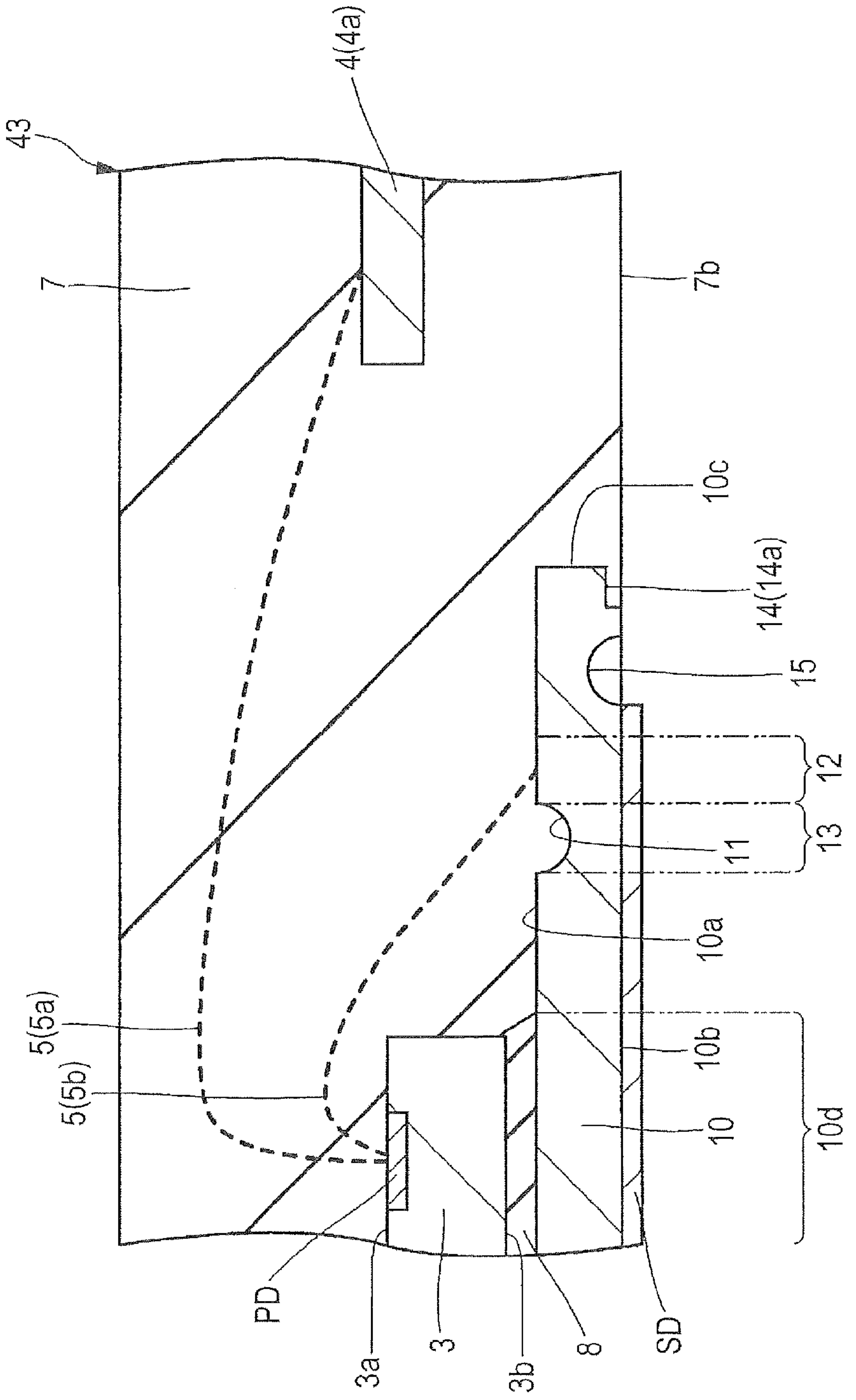
FIG. 29 is an enlarged sectional view showing a semiconductor device that is an other modification of FIG. 9.

Moreover, in the semiconductor device 1 explained in the embodiment, the configuration where the hollow part arrangement areas 13, 16 were provided over the upper surface 10*a* of the die pad 10, and the stepped part 14 and the groove part 15 were provided over the undersurface 10*b*, as shown in FIG. 9, was explained, but some of the configurations described above can be applied as a modification. FIG. 28 and FIG. 29 are enlarged sectional views showing other modifications to FIG. 9.

For example, a semiconductor device 42 shown in FIG. 28 differs from the semiconductor device 1 shown in FIG. 9 in a point that the stepped part 14 and the groove part 15 shown in FIG. 9 are not formed. In the semiconductor device 1, since the stepped part 14 and the groove part 15 are not provided, a resin burr 7*z* is easy to be formed so as to cover the peripheral part of the undersurface 10*b* of the die pad 10. For this reason, the need for adding the resin burr removal process arises, and therefore there is conceivable a case where moisture invades from the interstice between the sealed body 7 and the die pad 10. However, in the semiconductor device 42, since the hollow part arrangement area 16 is provided, a development of the exfoliation of the die pad 10 and the sealed body 7 can be delayed in the hollow part arrangement area 16. However, since it is conceivable that if moisture invades into the interface of the die pad 10 and the sealed body, it will become a cause of rust, etc., it is desirable to form the stepped part 14 and the groove part 15 as shown in FIG. 9 from the viewpoint of preventing the resin burr 7*z*.

Moreover, for example, a semiconductor device 43 shown in FIG. 29 differs from the semiconductor device 1 shown in FIG. 9 in a point that the hollow part arrangement area 16 shown in FIG. 9 is not provided. Thus, the plane area of the die pad 10 can be made small by not providing the hollow part arrangement area 16 shown in FIG. 9. For this reason, the semiconductor device 43 can be better miniaturized than the semiconductor device 1 shown in FIG. 9. On the other hand, if the hollow part arrangement area 16 shown in FIG. 9 is not provided, for example, when the sealed body 7 and the die pad 10 exfoliate over the side face 10*c* of the die pad 10, there will be an apprehension that the exfoliation will develop to the bonding part of the wire 5*b*. However, as described above, the exfoliation of the die pad 10 from the side face 10*c* side occurs originating in invasion of moisture in many cases, and by inhibiting the occurrence of the resin burr 7*z* (refer to FIG. 28), the burr removal process can be omitted or a stress to the resin by removal of the burr can be alleviated, and occurrence of the exfoliation can be inhibited considerably.

Moreover, although illustration is omitted, in the case where the hollow part arrangement areas 13, 16 (refer to FIG. 9) are not arranged over the upper surface of the die pad 10 (refer to FIG. 9) but the stepped part 14 (refer to FIG. 9) and the groove part 15 (refer to FIG. 9) are arranged over the undersurface 10*b* (refer to FIG. 9), although it becomes difficult to stop the development of exfoliation, it is possible to inhibit the occurrence of the resin burr 7*z* (refer to FIG. 28) that needs the resin burr removal process giving rise to the moisture invasion.

Moreover, in the above-mentioned embodiment, although there was explained the method whereby after forming the sealed body, the wettability of solder in mounting it over an unillustrated mounted substrate was improved by forming the metal film SD comprised of, for example, solder (outer plating film), the following modifications are applicable. That is, as a technology of improving the wettability of solder over a terminal surface of the semiconductor device, there is a method whereby a metal film is formed over the surface of the lead frame beforehand, i.e., a so-called previous plating method, in addition to the post plating method described above. The technology explained in the embodiment is applicable also in the case of this previous plating method.

When the previous plating method is applied, in the lead frame preparation process shown in FIG. 11, a surface metal film formation process of forming the surface metal film for improving the wettability of solder all over the exposed surface of the lead frame is added, for example, between a hollow part formation process and the surface roughening process. In this surface metal film formation process, a surface metal film comprised, for example, of nickel (Ni), palladium (Pd), and gold (Au) is formed by a plating method. Moreover, when the previous plating method is applied, the outer plating process shown in FIG. 11 can be omitted. For this reason, in the case of the semiconductor device to which the previous plating method is applied, the metal film SD comprised of solder as shown in FIG. 9 is not formed. Moreover, in the case of the semiconductor device to which the previous plating method is applied, a surface metal film comprised, for example, of nickel (Ni), palladium (Pd), and gold (Au) is formed all over the surfaces (upper surface and undersurface) of the die pad 10 and the lead 4.

Moreover, the configurations of the modifications explained using FIG. 25 to FIG. 29 can be applied in a combined form.

What is claimed is:

1. A semiconductor device, comprising:

a die pad that has a first plane and a second plane located on the opposite side of the first plane;

a plurality of leads arranged next to the die pad;

a semiconductor chip that has a surface, a plurality of electrodes formed over the surface, and a reverse side located on the opposite side of the surface, and is mounted over a chip mounting area of the first plane of the die pad;

a plurality of first wires that electrically couple one part of the electrodes of the semiconductor chip and the leads;

a second wire that electrically couples the other part of the electrodes of the semiconductor chip and the die pad; and a sealed body that seals the semiconductor chip, the first wires, and the second wire so that a part of each of the leads and the second plane of the die pad may be exposed, wherein an area of the first plane of the die pad is larger than an area of the reverse side of the semiconductor chip, wherein the first plane of the die pad comprises the chip mounting area, a first bonding area that is located between the chip mounting area and the leads and to which the second wire is bonded, and a first hollow part arrangement area that is arranged between the first binding area and the chip mounting area and in which a groove or a plurality of holes are formed, and wherein surface roughness of the first plane in the chip mounting area, the first bonding area, and the first hollow part arrangement area is coarser than surface roughness of the second plane.

2. The semiconductor device according to claim 1, wherein over the second plane of the die pad, a stepped part that ranges to a side face of the die pad and a groove part arranged between the central part and the stepped part of the second plane of the die pad are provided.

3. The semiconductor device according to claim 2, wherein a depth of the groove part is deeper than a depth of the stepped part.

4. The semiconductor device according to claim 3, wherein the first hollow part arrangement area is arranged at a position nearer to the side face of the die pad than the groove part is.

5. The semiconductor device according to claim 1, wherein the first plane of the die pad further comprises a second hollow part arrangement area that is arranged between the first bonding area and the peripheral part of the die pad and in which a groove or a plurality of holes are formed.

6. The semiconductor device according to claim 5, wherein the holes are formed in each of the first and the second hollow part arrangement areas, respectively, and wherein a second wire is bonded to an area surrounded by the holes.

7. The semiconductor device according to claim 1, wherein the holes are formed in the first hollow part arrangement area, and an arrangement space of the adjacent holes is equal to or less than twice an opening size of each of the holes.

8. The semiconductor device according to claim 1, wherein the groove is formed in the first hollow part arrangement area.

9. The method for manufacturing a semiconductor device according to claim 1, wherein, expressing the surface roughness of the first plane as ratio (Sr) of the surface area of the roughened surface to an unit area of a flat surface, Sr is equal to or more than 1.2.

* * * * *